United States Patent
Chiu et al.

(10) Patent No.: US 12,442,982 B2
(45) Date of Patent: Oct. 14, 2025

(54) TEMPERATURE SENSOR TO ACHIEVE THERMAL STABILIZATION OF MICRO-RING RESONATOR (MRR) IN AN OPEN CAVITY PHOTONIC INTEGRATED CIRCUIT (OCPIC)

(71) Applicant: Intel Corporation, Santa Clara, CA (US)

(72) Inventors: Chia-Pin Chiu, Tempe, AZ (US); Kaveh Hosseini, Livermore, CA (US); Omkar Karhade, Chandler, AZ (US); Tim Tri Hoang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 686 days.

(21) Appl. No.: 17/710,709

(22) Filed: Mar. 31, 2022

(65) Prior Publication Data

US 2023/0314704 A1     Oct. 5, 2023

(51) Int. Cl.
  *G02B 6/293* (2006.01)
  *G02B 6/12* (2006.01)
  *H01L 25/16* (2023.01)

(52) U.S. Cl.
  CPC ..... *G02B 6/29338* (2013.01); *G02B 6/12007* (2013.01); *G02B 6/29395* (2013.01); *H01L 25/167* (2013.01)

(58) Field of Classification Search
  None
  See application file for complete search history.

(56) References Cited

U.S. PATENT DOCUMENTS

| | | | | |
|---|---|---|---|---|
| 11,064,592 | B1* | 7/2021 | Bismuto | G02B 6/29328 |
| 11,556,020 | B1* | 1/2023 | Chen | G02F 1/0147 |
| 2006/0051010 | A1* | 3/2006 | Chu | G02B 6/12007 |
| | | | | 385/5 |
| 2010/0296768 | A1* | 11/2010 | Wu | G02F 1/0147 |
| | | | | 359/341.1 |
| 2012/0105177 | A1* | 5/2012 | McLaren | G02F 1/0147 |
| | | | | 333/17.1 |
| 2015/0318665 | A1* | 11/2015 | Liang | H01S 5/02461 |
| | | | | 372/34 |
| 2016/0124251 | A1* | 5/2016 | Zhang | G02F 1/2257 |
| | | | | 438/31 |
| 2019/0198487 | A1* | 6/2019 | Udrea | H10N 10/817 |

\* cited by examiner

*Primary Examiner* — Jerry Rahll
(74) *Attorney, Agent, or Firm* — Schwabe, Williamson & Wyatt, P.C.

(57) ABSTRACT

Embodiments disclosed herein include an optoelectronic system. In an embodiment, the optoelectronic system comprises a first substrate, a second substrate over the first substrate, and a micro-ring resonator (MRR) over the second substrate. In an embodiment, a heater is integrated into the MRR, a cladding is over the MRR, and a temperature sensor is over the MRR in the cladding.

20 Claims, 22 Drawing Sheets

TEMPERATURE SENSOR TO ACHIEVE THERMAL STABILIZATION OF MICRO-RING RESONATOR (MRR) IN AN OPEN CAVITY PHOTONIC INTEGRATED CIRCUIT (OCPIC)

GOVERNMENT LICENSE RIGHTS

This invention was made with Government support under Agreement No. HR00111830002, awarded by the United States Department of Defense. The Government has certain rights in the invention.

TECHNICAL FIELD

Embodiments of the present disclosure relate to electronic packages, and more particularly to electronic packages with micro-ring resonators (MRRs) for on-cavity photonics integrated circuits (OCPICs).

BACKGROUND

Silicon photonics micro-ring resonators (MRRs) in open-cavity photonic integrated circuits (OCPICs) are typically fabricated on a silicon-on-insulator (SOI) wafer. The SOI wafer may have a buried oxide and a thin silicon layer over the buried oxide. For example, the buried oxide may have a thickness of approximately 2 μm and the silicon layer may have a thickness of approximately 220 nm. A heater is normally integrated into the MRR to enable wavelength resonance tuning. Applying heat shifts the resonance frequency of the MRR. This is particularly useful in wavelength division multiplexing systems proposed in the co-packaged optical I/O context. To take advantage of the good thermal-optical coefficient of silicon, an integrated heater is formed in the center of the micro-ring using the same P and P$^+$ doping regions to minimize the number of necessary mask layers, which minimizes fabrication costs. The integrated heater inside the ring can heat up the ring and red-shift the resonance.

Controlling the temperature of the MRR is important in order to enable the wavelength division multiplexing. In some instances, channels are formed around the MRR in order to improve thermal isolation. This allows for high temperatures to be reached, and limits thermal cross-talk. Control of the temperature may be implemented by a temperature sensor that is provided proximate to the MRR. However, the existing temperature sensors are separated from the MRR by a cladding that does not have good thermal conductivity. As such, the measured temperature is typically not the same as the temperature of the MRR.

EMBODIMENTS OF THE PRESENT DISCLOSURE

Described herein are electronic packages with micro-ring resonators (MRRs) for on-cavity photonics integrated circuits (OCPICs), in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
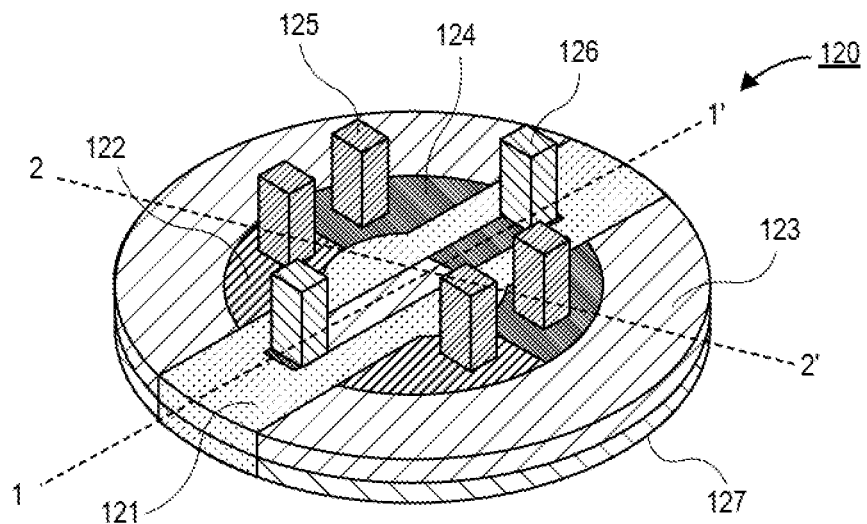
FIG. 1A is perspective view illustration of a micro-ring resonator (MRR), in accordance with an embodiment.

As noted above, micro-ring resonators (MRRs) in open-cavity photonic integrated circuits (OCPICs) may include heaters in order to shift the resonance of the MRRs. The heaters may be formed in the center or the MRR. An example of one such MRR 120 is shown in FIG. 1A. As shown, a bottom N-doped region 127 is provided as a base of the MRR 120. A lightly doped P-region 123 may be provided over the N-doped region 127. A highly doped P-region (P$^+$) 124 and a highly doped N-region (N$^+$) 122 may be provided within the lightly doped P-region 123. An intrinsic silicon region 121 may extend across a center of the MRR 120. In an embodiment, heater contacts 126 may be in an inner opening through the intrinsic silicon region 121. Modulator contacts 125 may be provided in the P$^+$ region 124 and the N$^+$ region 122. The power efficiency of the integrated heater becomes very critical because it will impact the overall pJ/bit target of the channel and the WDM system. To optimize pJ/bit, increasing the power efficiency of the integrated heater becomes very critical for the OCPIC packaging design. In FIG. 1A, sectional lines 1-1' and 2-2' are shown. The sectional line 1-1' may be the orientation of the cross-sectional illustrations shown in FIGS. 1C to 5D, and the sectional line 2-2' may be the orientation of the cross-sectional illustrations shown in FIGS. 7A-7C.

While a particular example of one MRR 120 architecture is shown in FIG. 1A, it is to be appreciated that improvements disclosed herein may be applicable to any MRR 120 architecture. That is, embodiments are not limited to MRRs 120 that are exactly as shown in FIG. 1A.

In existing solutions, thermal isolation trenches, undercuts, and bottom etching have been used to increase the thermal tuning efficiency of MRRs. However, the etching process of these solutions start from the top side of the OCPIC and leave holes or cavities on the OCPIC top surface. These holes and cavities will occupy some of the real estate on the top surface, which restricts bump placement, interferes with underfill flow, and potentially can lead to bumping or reliability issues, especially with an OCPIC with an electronic integrated circuit (EIC) mounted on top of the OCPIC. Some solutions may include etching cavities from the bottom side of the OCPIC. However, such architectures only include etching through the silicon substrate. That is, the buried oxide (BOX) and the cladding over the BOX are not etched. As such, the thermal isolation is not optimized.

Accordingly, embodiments disclosed herein include a backside etching process that provides a cavity through the silicon substrate, the BOX, and the cladding. In one embodiment, a cavity extends through the silicon substrate and the BOX and exposes a bottom surface of the MRR. In another embodiment, the cavity continues into the cladding along the sidewalls of the MRR. In yet another embodiment, the cavity into the cladding extends past a thickness of the MRR.

In such embodiments, a backside cavity is formed. The backside cavity may result in difficulties in attaching the OCPIC to the substrate (e.g., with an adhesive or die attach film (DAF)). Accordingly, in some embodiments, a base is provided over the bottom surface of the silicon substrate. The base may be another piece of silicon, or glass. The base may be bonded to the silicon substrate with an adhesive, diffusion bonding, or any other suitable bonding mechanism. In such embodiments, the backside cavity may be sealed by the base.

While backside cavities can be used to increase thermal isolation of the MRR, embodiments are still not entirely protected from thermal cross-talk from other devices. That is, the MRR temperature is not only impacted by the micro heater. For example, the MRR temperature may also be influenced by thermal cross-talk from the EIC and the CPU/GPU/FPGA in the same package. To maintain thermal stabilization of the MRR, accurate micro-ring temperature tracking is required to control the micro heater such that the MRR can be maintained steadily at the desired temperature, even if the powers of the EIC and the CPU/GPU/FPGA keep fluctuating due to time-to-time work load variation.

Accordingly, embodiments disclosed herein include a metallic temperature sensor that will be placed right above the micro-ring with a distance of at least 2 µm to avoid the light absorption by the metal. A thermal conductor with a low refraction index (e.g., SiN, $Si_3N_4$, or AlN) will replace the oxide cladding in between the temperature sensor and the micro-ring such that the sensor can capture the micro-ring temperature accurately.

In an embodiment, the OCPIC is mounted to an EIC through solder bumps or the like. In order to enable a reliable mechanical structure, the underlying cavity needs to be outside of the shadow of the solder bumps. Typically, the MRR and the underlying cavity are placed between the solder bumps (e.g., at the center of a square bump layout pattern). As can be appreciated, the diameter of the cavity is constricted by the bump pitch and the bump diameter. Ideally, larger cavities are desired in order to improve the thermal isolation of the MRR.

Accordingly, embodiments disclosed herein include a bump and MRR layout that has the MRR in a line with the bumps of a $T_X$ cell. By moving the MRR to be in a line with the bumps, a larger diameter cavity is enabled. Additionally, the increase in the footprint of the $T_X$ cell is minimal because the X-pitch direction can be reduced compared to existing architectures. For example, the X-pitch may be reduced to 45 μm from 55 μm. For a four bump $T_X$ cell, this provides a reduction of 40 μm in the length of the $T_X$ cell. The extra space can then be replaced with the MRR (at the 45 μm pitch) which results in a total increase of only 5 μm in the length of the $T_X$ cell. Additionally, the Y-pitch can be decreased to 45 μm in order to increase the waveguide density. Accordingly, OCPICs with improved thermal isolation (due to larger cavities) can be obtained without significantly increasing the footprint of the $T_X$ cells.

Figure 1B:
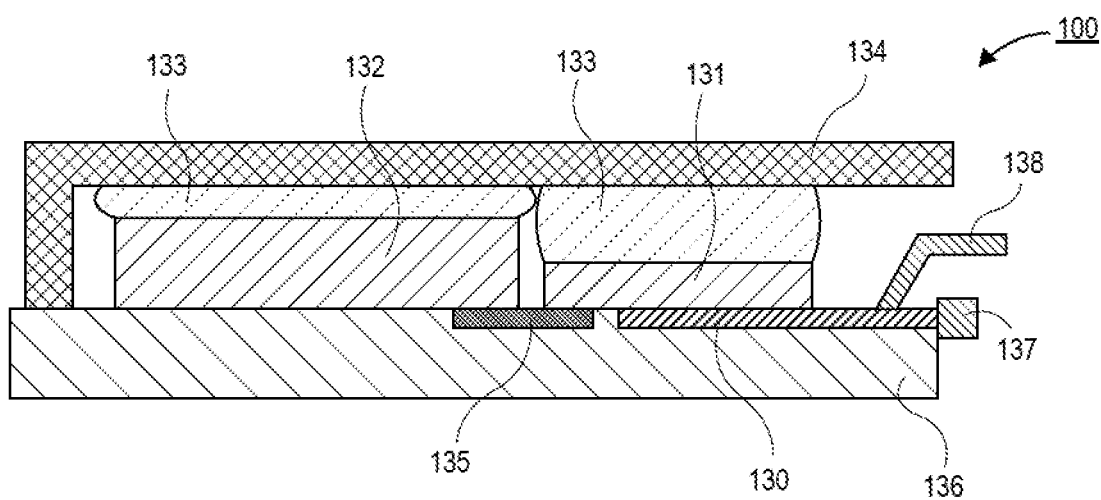
FIG. 1B is a cross-sectional illustration of an optoelectronic system that includes an open-cavity photonics integrated circuit (OCPIC), in accordance with an embodiment.

Referring now to FIG. 1B, a cross-sectional illustration of an optoelectronic system 100 is shown, in accordance with an embodiment. In an embodiment, the optoelectronic system 100 may include a package substrate 136. The package substrate 136 may be an organic substrate. For example, a plurality of laminated organic layers may be used to form the package substrate 136. In some embodiment, the package substrate 136 may include a core (not shown). The package substrate 136 may comprise conductive routing (e.g., pads, traces, vias, etc.) in order to provide electrical routing for the optoelectronic system 100.

In an embodiment, an OCPIC 130 may be provided on the package substrate 136. The OCPIC 130 may include a plurality of MRRs. The structure of the MRRs within the OCPIC 130 will be described in greater detail below. In an embodiment, the OCPIC 130 may be formed on a silicon on insulator (SOI) substrate. For example, the MRR may be formed in a thin semiconductor layer provided over the buried oxide (BOX).

In an embodiment, one or more fiber array units (FAUs) 137 and 138 may be optically coupled to the OCPIC 130. For example, a top side FAU 138 may be coupled to the OCPIC 130 through a grating coupler or the like, and an edge FAU 137 may be coupled to the OCPIC 130 through a micro-lens structure, edge coupling, and/or a V-groove coupling.

In an embodiment, the OCPIC 130 may be electrically coupled to an EIC 131. The EIC 131 may be provided above the OCPIC 130 over the package substrate 136. The EIC 131 may be coupled to the OCPIC 130 by solder bumps or the like (not shown in FIG. 1B). In an embodiment, the EIC 131 may be coupled to a die 132 by an embedded bridge 135. The embedded bridge 135 may be a silicon substrate with high density routing in order to electrically and communicatively couple the EIC 131 to the die 132. In an embodiment, the die 132 may comprise a CPU, a GPU, a FPGA, or the like.

In an embodiment, an integrated heat spreader (IHS) 134 may be provided over the EIC 131 and the die 132. The EIC 131 and the die 132 may be thermally coupled to the IHS 134 by a thermal interface material (TIM) 133 or the like. In an embodiment, a cooling solution (e.g., heatsink) may be provided over the IHS 134.

Figure 1C:
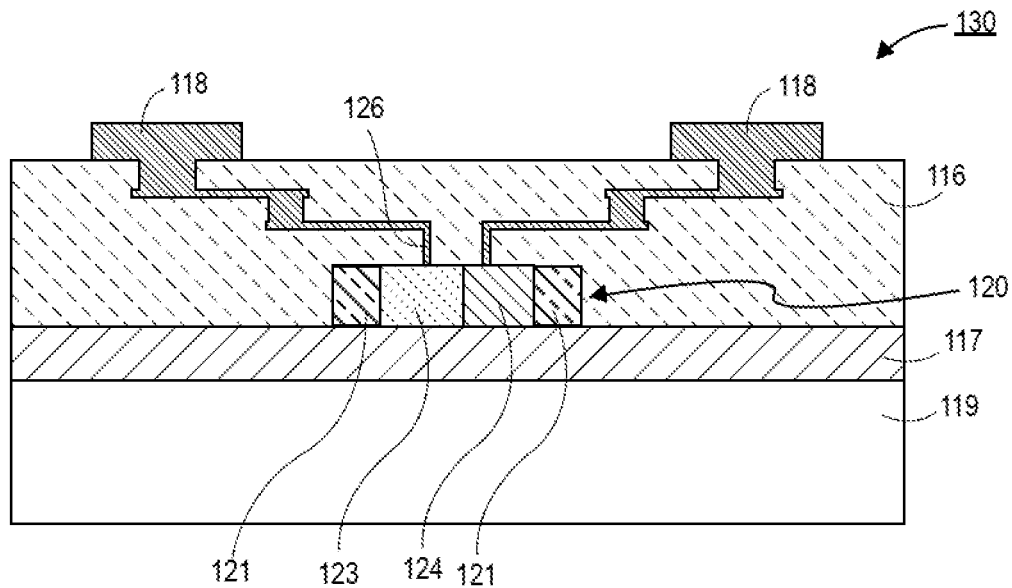
FIG. 1C is a cross-sectional illustration of an MRR in an OCPIC, in accordance with an embodiment.

Referring now to FIG. 1C, a cross-sectional illustration of a portion of an OCPIC 130 along line 1-1' in FIG. 1A is shown, in accordance with an embodiment. In an embodiment, the OCPIC 130 may be fabricated on a SOI substrate. For example, the SOI substrate may include a silicon substrate 119 and a BOX 117 over the silicon substrate 119. In an embodiment, a thin semiconductor layer may be provided over the BOX 117. The MRR 120 is fabricated in the thin semiconductor layer. For example, the semiconductor layer may be approximately 220 nm thick or thinner. In an embodiment, a cladding 116 is provided over the MRR 120 and the BOX 117. As used herein, "approximately" may refer to a range of values within ten percent of the stated value. For example, approximately 100 nm may refer to a range between 90 nm and 110 nm.

In an embodiment, the MRR 120 is shown along the cross-section highlighted as line 1-1' in FIG. 1A. In an embodiment, the MRR 120 comprises intrinsic silicon regions 121 at the edges of the MRR 120. A lightly P-doped region 123 may be provided adjacent to one end of the intrinsic silicon region 121, and a highly P-doped ($P^+$) region 124 may be adjacent to the other end of the intrinsic silicon region 121. The $P^+$ region 124 and the lightly P-doped region 123 may contact each other at the center of the MRR 120. In an embodiment, heater contacts 126 may be provided over the $P^+$ region 124 and the lightly P-doped region 123. In an embodiment, the combination of the $P^+$ region 124 and the lightly P-doped region 123 may be considered as being the heater of the MRR 120. Heater contacts 126 couple the $P^+$ region 124 and the lightly P-doped region 123 to pads 118 on a top surface of the cladding layer 116.

It is to be appreciated that the thermal isolation of the MRR 120 in FIG. 1C is poor. This is because thermal energy from the MRR 120 easily transfers down into the underlying silicon substrate 119, which is a good thermal conductor and removes heat from the MRR 120. As such, high and stable temperatures cannot be obtained with the OCPIC 130 construction shown in FIG. 1C.

Accordingly, embodiments disclosed herein include cavities formed below (and around) the MRR. The cavities are air filled, and air has a low thermal conductivity. As such, the thermal energy produced by the heater remains with the MRR instead of being spread to other parts of the OCPIC. Therefore, high temperatures for the MRR can be obtained, and the control of the temperature is excellent which provides stable temperatures. While referred to an OCPIC, it is to be appreciated that MRR architectures disclosed herein may be part of any PIC architecture. For example, the MRR can be in any PIC, and is not limited to PICs embedded in a substrate as in an OCPIC.

Figure 2A:
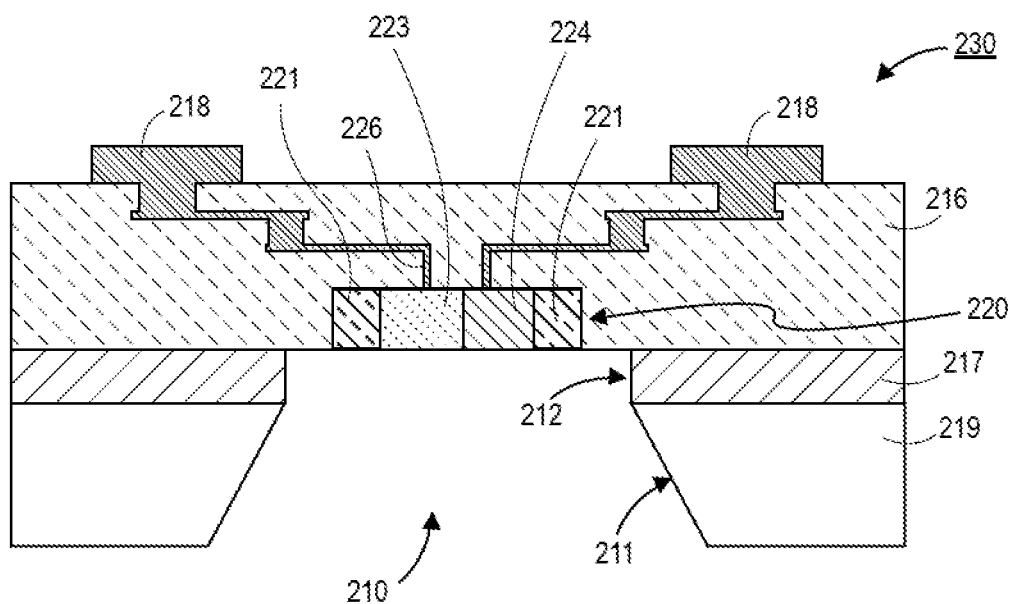
FIG. 2A is a cross-sectional illustration of an MRR in an OCPIC with a backside cavity with tapered sidewalls, in accordance with an embodiment.

Referring now to FIG. 2A, a cross-sectional illustration of an OCPIC 230 is shown, in accordance with an embodiment. The cross-section shown in FIG. 2A is along the line 1-1' in FIG. 1A. In an embodiment, the OCPIC 230 comprises a silicon substrate 219. A BOX 217 is provided over the silicon substrate 219. In an embodiment, an MRR 220 is provided above the BOX 217 in a cladding layer 216. In an embodiment, the MRR 220 comprises intrinsic silicon regions 221 at the edges of the MRR 220. A lightly P-doped region 223 may be provided adjacent to one end of the intrinsic silicon region 221, and a highly P-doped ($P^+$) region 224 may be adjacent to the other end of the intrinsic silicon region 221. The $P^+$ region 224 and the lightly P-doped region 223 may contact each other at the center of the MRR 220. In an embodiment, heater contacts 226 may be provided over the $P^+$ region 224 and the lightly P-doped region 223. In an embodiment, the combination of the $P^+$ region 224 and the lightly P-doped region 223 may be considered as being the micro heater of the MRR 220. Heater contacts 226 couple the $P^+$ region 224 and the lightly P-doped region 223 to pads 218 on a top surface of the cladding layer 216.

In an embodiment, thermal isolation of the MRR 220 is provided by a cavity 210 that is formed in the backside of the OCPIC 230. That is, there is no trench or opening provided from the front side of the OCPIC 230 where the pads 218 are provided. This allows for greater flexibility in the pad 218 placement and routing between the pads 218 and the contacts 226. In an embodiment, the cavity 210 may pass through the silicon substrate 219. Additionally, the cavity 210 may pass through the BOX 217. This allows for a bottom surface of the MRR 220 to be exposed. A width of the cavity 210 may be wider than a width of the MRR 220. In an embodiment, the cavity 210 may have sidewalls 211 through the silicon substrate 219 that are tapered or sloped. Such an architecture may occur when a wet etching process is used to form the cavity 210. In an embodiment, sidewalls 212 through the BOX 217 may be substantially vertical. In an embodiment, a bottom surface of the cladding 216 may be exposed by the cavity 210.

Figure 2B:
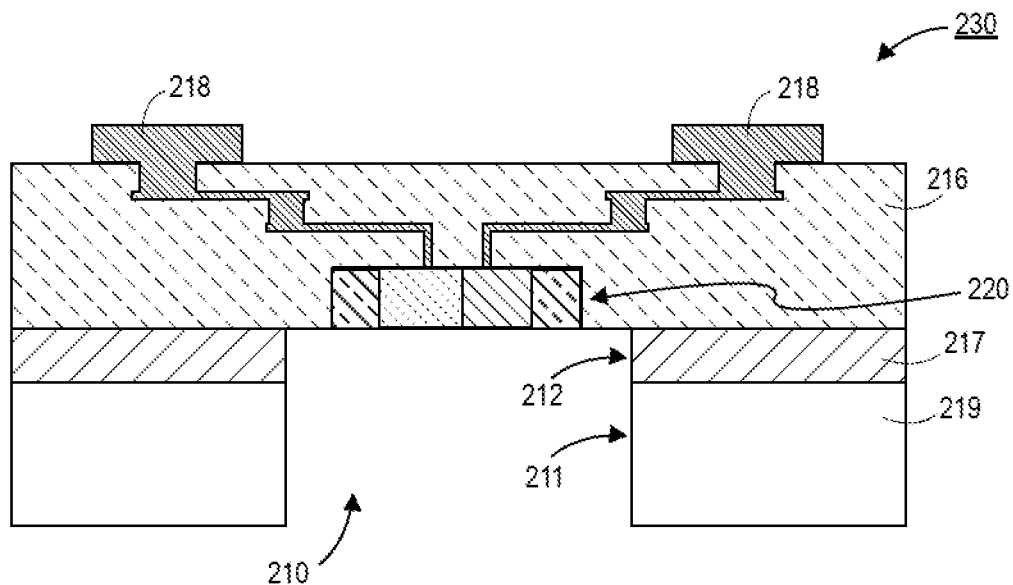
FIG. 2B is a cross-sectional illustration of an MRR in an OCPIC with a backside cavity with vertical sidewalls, in accordance with an embodiment.

Referring now to FIG. 2B, a cross-sectional illustration of an OCPIC 230 is shown, in accordance with an additional embodiment. In an embodiment, the OCPIC 230 may be substantially similar to the OCPIC 230 in FIG. 2A, with the exception of the structure of the sidewalls 211 through the silicon substrate 219. Instead of being tapered or sloped, the sidewalls 211 are substantially vertical. Vertical sidewalls may be provided when a dry etching (e.g., a plasma etching) process is used in order to form the cavity 210. In such an embodiment, the width of the cavity 210 in the BOX 217 may be substantially equal to a width of the cavity 210 through the silicon substrate 219.

Figure 2C:
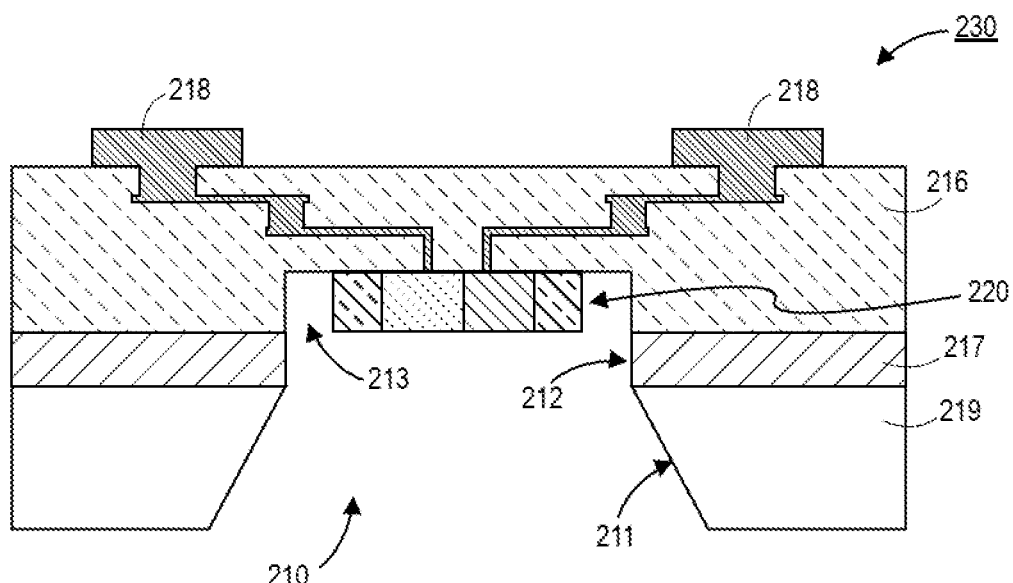
FIG. 2C is a cross-sectional illustration of an MRR in an OCPIC with a backside cavity with sloped sidewalls that extends into the cladding around the MRR, in accordance with an embodiment.

Referring now to FIG. 2C, a cross-sectional illustration of an OCPIC 230 is shown, in accordance with an additional embodiment. In an embodiment, the OCPIC 230 is substantially similar to the OCPIC 230 in FIG. 2A, with the exception of the structure of the cavity 210. Instead of stopping at the cladding layer 216, the cavity 210 may continue into the cladding layer 216 adjacent to the MRR 220. For example, extensions 213 may expose sidewall surfaces of the MRR 220. The exposure of the sidewall surfaces to the air of the cavity 210 further improves the thermal isolation of the MRR 220. In an embodiment, the extensions 213 may extend a depth into the cladding 216 that is substantially equal to a thickness of the MRR 220. For example, the extensions 213 may extend approximately 220 nm into the cladding 216 in some embodiments. In the illustrated embodiment, the sidewalls 211 of the cavity 210 in the silicon substrate 219 may be tapered or sloped.

Figure 2D:
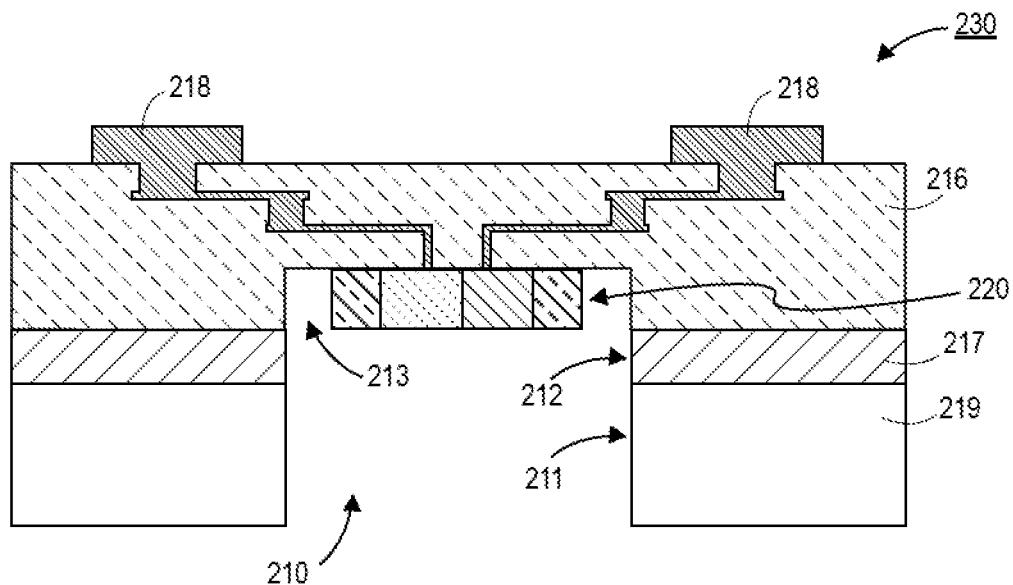
FIG. 2D is a cross-sectional illustration of an MRR in an OCPIC with a backside cavity with vertical sidewalls that extends into the cladding around the MRR, in accordance with an embodiment.

Referring now to FIG. 2D, a cross-sectional illustration of an OCPIC 230 is shown, in accordance with an additional embodiment. In an embodiment, the OCPIC 230 in FIG. 2D may be substantially similar to the OCPIC 230 in FIG. 2C, with the exception of the sidewalls 211 of the cavity 210 through the silicon substrate 219. Instead of having tapered sidewalls, the sidewalls 211 of the cavity 210 through the silicon substrate 219 are substantially vertical. In such an embodiment, the vertical sidewalls 211, 212, and the sidewall of the cladding 216 in the extensions 213 may be substantially coplanar with each other.

Figure 2E:
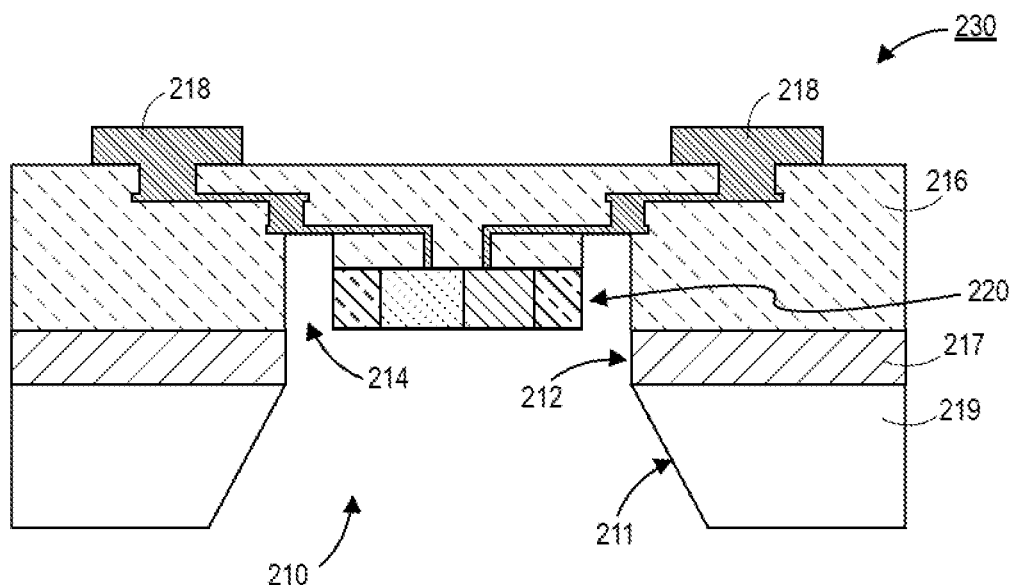
FIG. 2E is a cross-sectional illustration of an MRR in an OCPIC with a backside cavity with sloped sidewalls that extends into the cladding past the thickness of the MRR, in accordance with an embodiment.

Referring now to FIG. 2E, a cross-sectional illustration of an OCPIC 230 is shown, in accordance with yet another additional embodiment. In an embodiment, the OCPIC 230 in FIG. 2E may be substantially similar to the OCPIC 230 in FIG. 2C, with the exception of the structure of the cavity 210. Instead of having extensions 213 that end at the top of the MRR 220, the cavity 210 includes extensions 214 that extend past a top surface of the MRR 220. In a particular embodiment, the extensions 214 may extend up to routing layers. For example, the extensions 214 may extend approximately 2 μm past the top surface of the MRR 220. Extending the cavity 210 even further increases the thermal isolation of the MRR 220. In the illustrated embodiment, the sidewalls 211 of the cavity 210 in the silicon substrate 219 may be tapered or sloped.

Figure 2F:
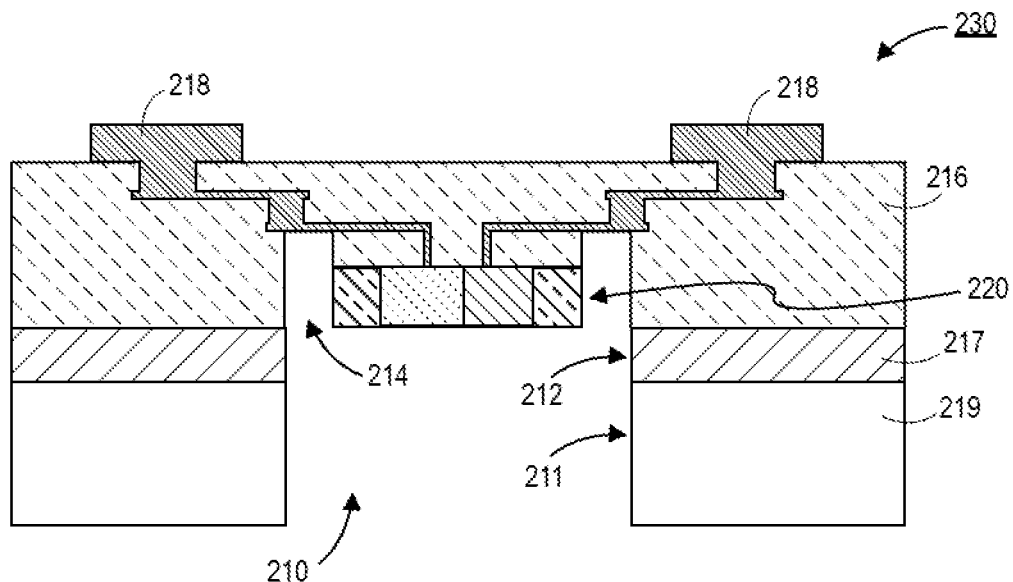
FIG. 2F is a cross-sectional illustration of an MRR in an OCPIC with a backside cavity with vertical sidewalls that extends into the cladding past the thickness of the MRR, in accordance with an embodiment.

Referring now to FIG. 2F, a cross-sectional illustration of an OCPIC 230 is shown, in accordance with another additional embodiment. In an embodiment, the OCPIC 230 is substantially similar to the OCPIC 230 in FIG. 2E, with the exception of the sidewalls 211 of the cavity 210 through the silicon substrate 219. Instead of being sloped or tapered, the sidewalls 211 in FIG. 2E are substantially vertical. That is, the sidewalls 211 in the silicon substrate 219 may be substantially coplanar with the sidewalls 212 in the BOX 217 and the sidewalls of the cladding 216 in the extensions 214.

Referring now to FIGS. 3A-3G, a series of cross-sectional illustrations depicting a process for forming an OCPIC 330 is shown, in accordance with an embodiment. In the illustrated embodiments, the sidewalls of the silicon substrate 319 are substantially vertical. However, it is to be appreciated that sloped or tapered sidewalls may also be provided if a different etching process is used to form the cavity 310.

Figure 3A:
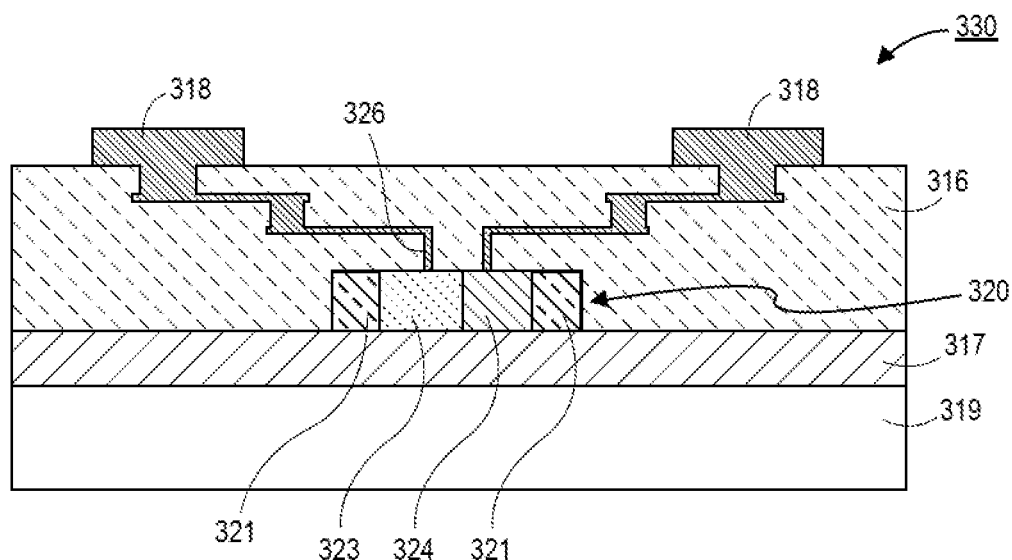
FIGS. 3A-3G are cross-sectional illustrations depicting a process for forming an a backside etching of an MRR in an OCPIC, in accordance with an embodiment.

Referring now to FIG. 3A, a cross-sectional illustration of a portion of an OCPIC 330 is shown, in accordance with an embodiment. The cross-section shown in FIG. 3A is along the line 1-1' in FIG. 1A. In an embodiment, the OCPIC 330 comprises a silicon substrate 319. A BOX 317 is provided over the silicon substrate 319. In an embodiment, an MRR 320 is provided above the BOX 317 in a cladding layer 316. In an embodiment, the MRR 320 comprises intrinsic silicon regions 321 at the edges of the MRR 320. A lightly P-doped region 323 may be provided adjacent to one end of the intrinsic silicon region 321, and a highly P-doped (P$^+$) region 324 may be adjacent to the other end of the intrinsic silicon region 321. The P$^+$ region 324 and the lightly P-doped region 323 may contact each other at the center of the MRR 320. In an embodiment, heater contacts 326 may be provided over the P$^+$ region 324 and the lightly P-doped region 323. In an embodiment, the combination of the P$^+$ region 324 and the lightly P-doped region 323 may be considered as being the micro heater of the MRR 320. Heater contacts 326 couple the P$^+$ region 324 and the lightly P-doped region 323 to pads 318 on a top surface of the cladding layer 316.

Figure 3B:
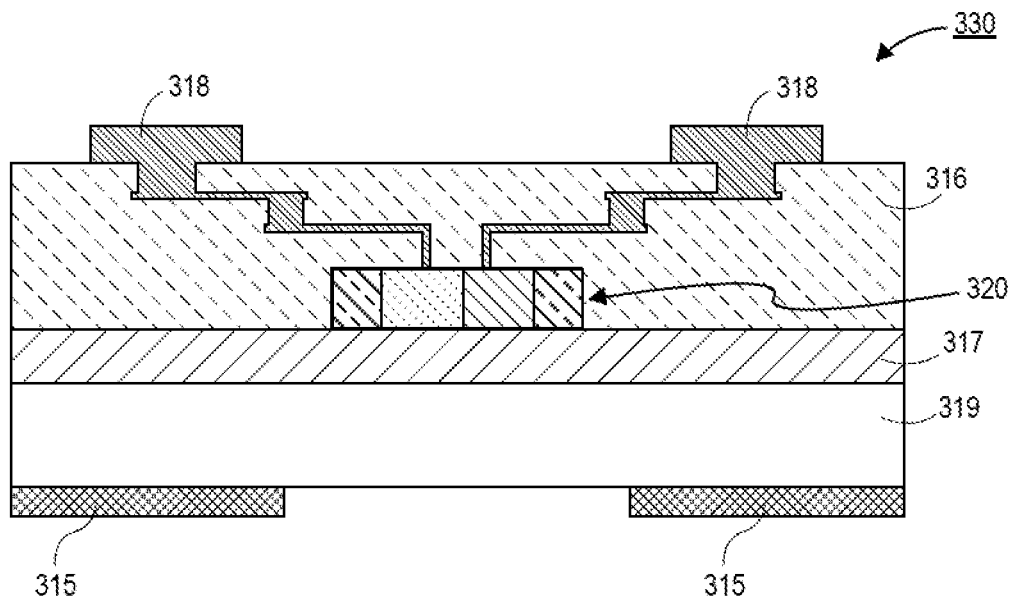

Referring now to FIG. 3B, a cross-sectional illustration of the OCPIC 330 after a mask layer 315 is provided on the silicon substrate 319 is shown, in accordance with an embodiment. In an embodiment, the mask layer 315 may be a photolithography mask. For example, the mask layer 315 may be deposited (e.g., with a spin coating process), exposed, and developed. The mask layer 315 includes an opening that is substantially below the MRR 320.

Figure 3C:
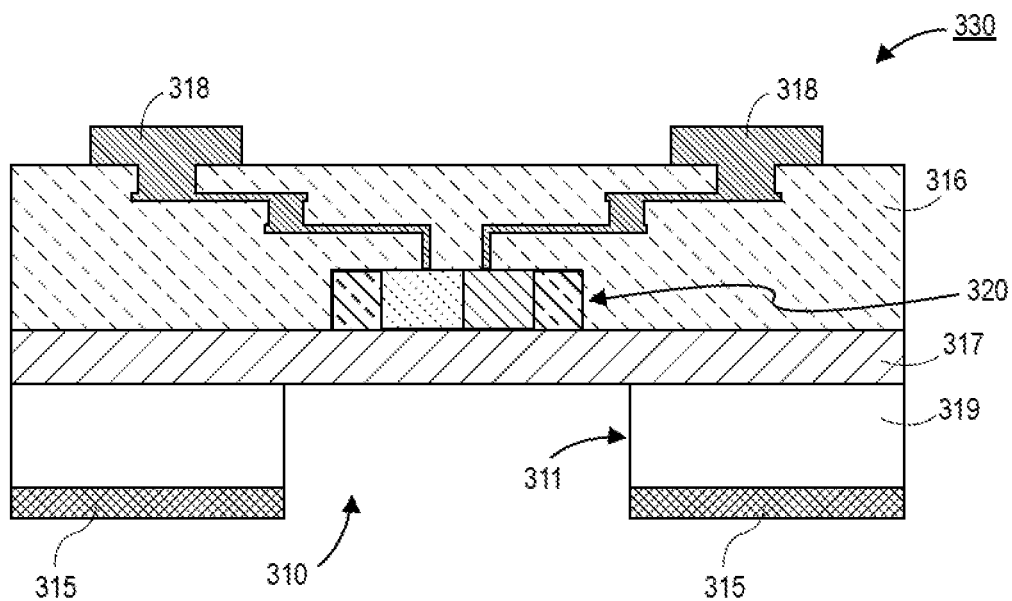

Referring now to FIG. 3C, a cross-sectional illustration of the OCPIC 330 after a cavity 310 is formed into the silicon substrate 319 is shown, in accordance with an embodiment. In an embodiment, the silicon substrate 319 may be etched with a dry etching process. As such, sidewalls 311 through the silicon substrate 319 may be substantially vertical. In other embodiments, a wet etch may be used, which would provide sloped sidewalls.

Figure 3D:
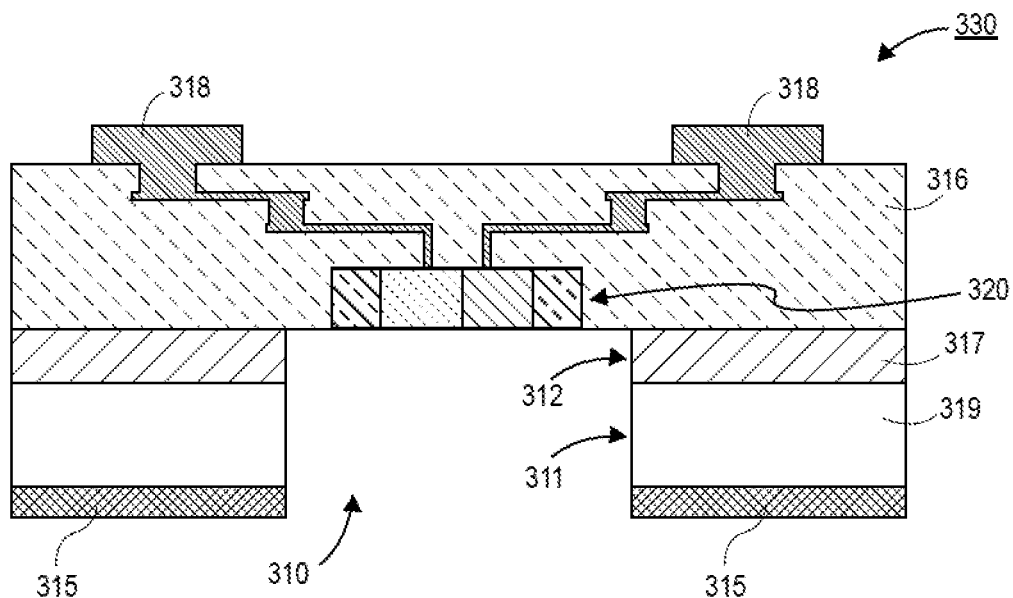

Referring now to FIG. 3D, a cross-sectional illustration of the OCPIC 330 after the cavity 310 is continued into the BOX 317 is shown, in accordance with an embodiment. In an embodiment, the BOX 317 may be etched with a dry etching process and have substantially vertical sidewalls 312. In an embodiment, the sidewalls 311 and 312 may be substantially coplanar with each other. In an embodiment, the etching of the BOX 317 may result in the bottom surface of the MRR 320 being exposed. In some embodiments, the formation of the cavity 310 may be halted at this point. That is, embodiments include cavities 310 that only pass through the silicon substrate 319 and the BOX 317.

Figure 3E:
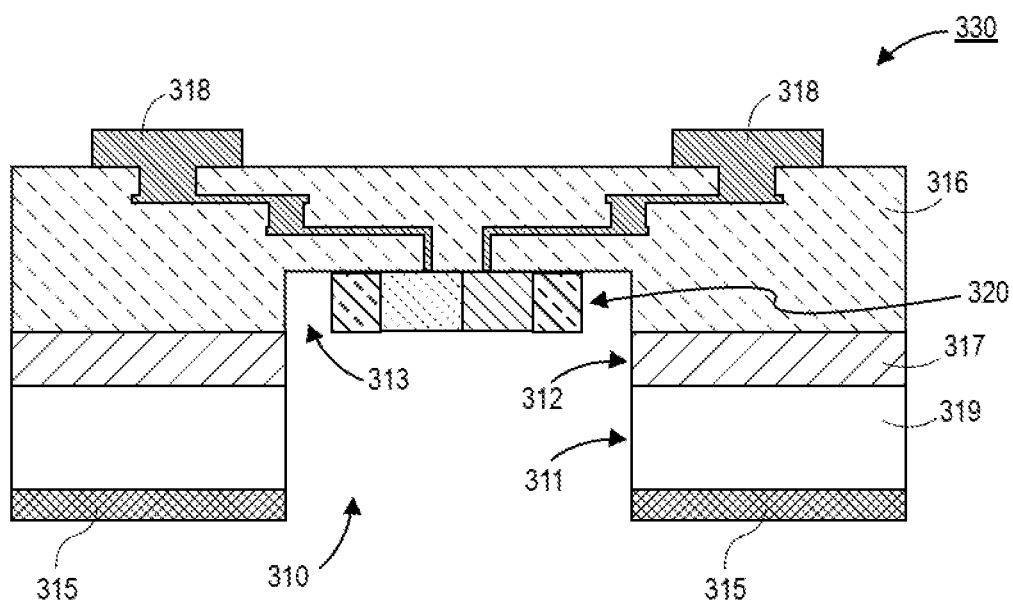

Referring now to FIG. 3E, a cross-sectional illustration of the OCPIC 330 after the cavity 310 is continued into the cladding 316 is shown, in accordance with an embodiment. In an embodiment, the cladding 316 adjacent to the MRR 320 may be etched to form extensions 313 of the cavity 310. The extensions 313 may extend into the cladding 316 up to a top surface of the MRR 320. In some embodiments, the formation of the cavity 310 may be halted at this point. That is, embodiments include cavities 310 that pass through the silicon substrate 319 and the BOX 317, and into the cladding 316 up to a thickness of the MRR 320.

Figure 3F:
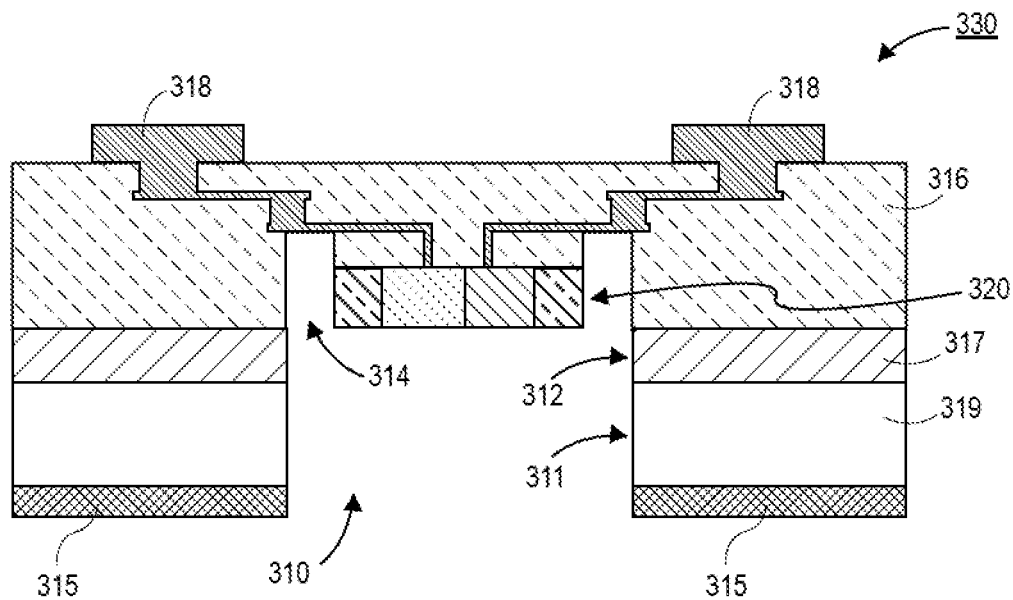

Referring now to FIG. 3F, a cross-sectional illustration of the OCPIC 330 after the cavity 310 is continued into the cladding 316 is shown, in accordance with an additional embodiment. As shown, the cladding 316 may continue to be etched to form extensions 314. The extensions 314 may continue vertically past a top surface of the MRR 320. In an embodiment, the extensions 314 may continue up to a routing layer in the cladding 316. In an embodiment, the extensions 314 may extend approximately 2 µm past the top surface of the MRR 320.

Figure 3G:
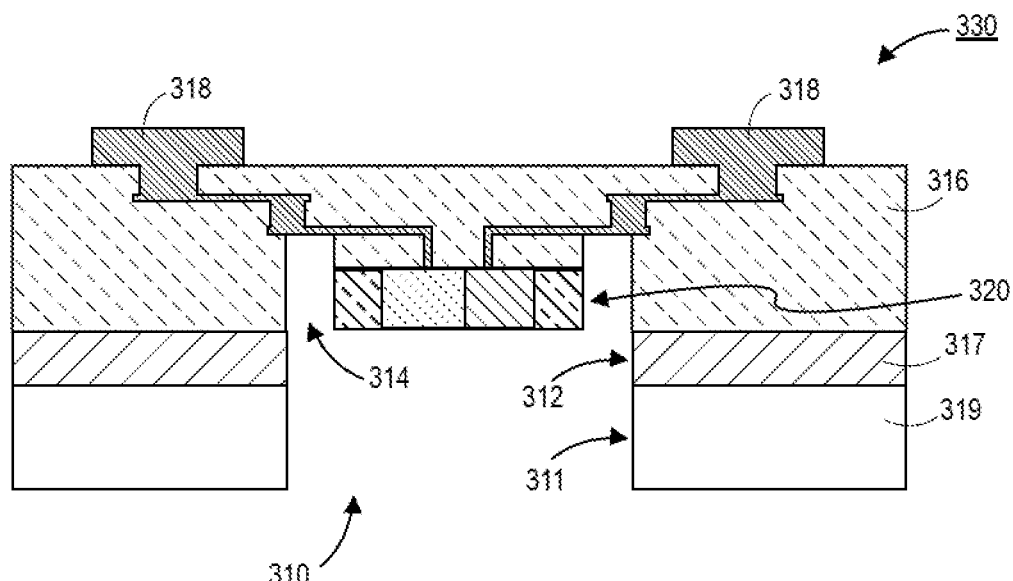

Referring now to FIG. 3G, a cross-sectional illustration of the OCPIC 330 after the mask layer 315 is removed is shown, in accordance with an embodiment. In an embodiment, the mask layer 315 may be removed with a resist stripping process, an etching process, or the like.

In the embodiments illustrated above, the bottom surface of the OCPIC 330 may comprise a plurality of cavities. The presence of the cavities may result in assembly and reliability problems. For example, the OCPIC may be attached to the package substrate by an adhesive, a DAF, or the like. The many different cavities results in a decrease in the surface area available for bonding, and the bond between the OCPIC and the package substrate may not be as strong as desired. Accordingly, embodiments disclosed herein include the addition of a base over the bottom of the silicon substrate. The base provides a continuous flat surface that improves the bonding between the OCPIC and the package substrate.

Figure 4A:
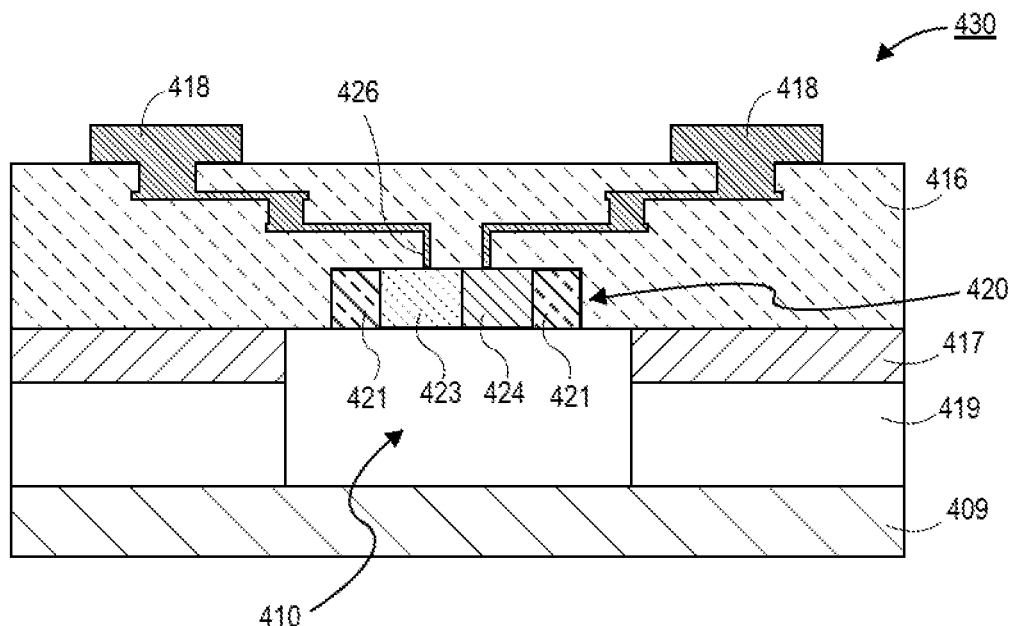
FIG. 4A is a cross-sectional illustration of an MRR in an OCPIC with a backside cavity that is sealed by a base on the backside of the OCPIC, in accordance with an embodiment.

Referring now to FIG. 4A, a cross-sectional illustration of a portion of an OCPIC 430 is shown, in accordance with an embodiment. The cross-section shown in FIG. 4A is along the line 1-1' in FIG. 1A. In an embodiment, the OCPIC 430 comprises a silicon substrate 419. A BOX 417 is provided over the silicon substrate 419. In an embodiment, an MRR 420 is provided above the BOX 417 in a cladding layer 416. In an embodiment, the MRR 420 comprises intrinsic silicon regions 421 at the edges of the MRR 420. A lightly P-doped region 423 may be provided adjacent to one end of the intrinsic silicon region 421, and a highly P-doped (P$^+$) region 424 may be adjacent to the other end of the intrinsic silicon region 421. The P$^+$ region 424 and the lightly P-doped region 423 may contact each other at the center of the MRR 420. In an embodiment, heater contacts 426 may be provided over the P$^+$ region 424 and the lightly P-doped region 423. In an embodiment, the combination of the P$^+$ region 424 and the lightly P-doped region 423 may be considered as being the micro heater of the MRR 420. Heater contacts 426 couple the P$^+$ region 424 and the lightly P-doped region 423 to pads 418 on a top surface of the cladding layer 416.

In an embodiment, a cavity 410 is provided through the backside layers of the OCPIC 430. For example, the cavity 410 may pass through the silicon substrate 419 and the BOX 417. The cavity 410 exposes a backside surface of the MRR 420 to air. In an embodiment, the cavity 410 may be sealed by a base 409. In an embodiment, the base 409 may comprise silicon. In other embodiments, the base 409 may comprise glass. The base 409 may be bonded to the silicon substrate 419 using any suitable attachment means. For example, an adhesion layer (not shown) may be provided between the silicon substrate 419 and the base 409. In other embodiments diffusion bonding may be used to bond the silicon substrate 419 to the base 409.

Figure 4B:
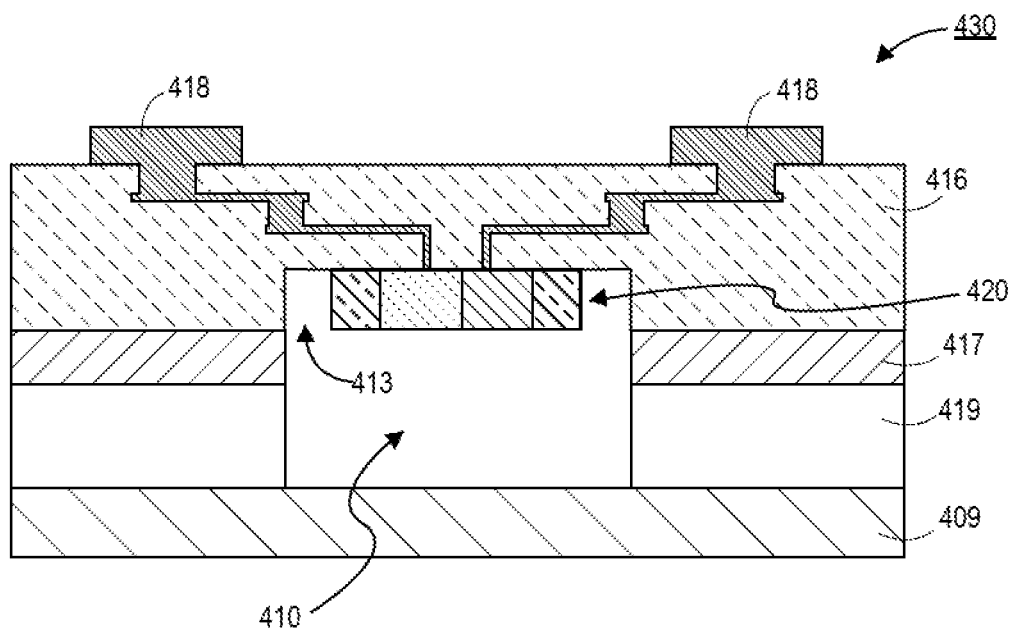
FIG. 4B is a cross-sectional illustration of an MRR in an OCPIC with a backside cavity that extends into the cladding adjacent to the MRR and is sealed by a base on the backside of the OCPIC, in accordance with an embodiment.

Referring now to FIG. 4B, a cross-sectional illustration of a portion of an OCPIC 430 is shown, in accordance with an additional embodiment. In an embodiment, the OCPIC 430 in FIG. 4B may be substantially similar to the OCPIC 430 in FIG. 4A, with the exception of the structure of the cavity 410. In addition to the cavity 410 shown in FIG. 4A, the cavity 410 in FIG. 4B includes extensions 413. The extensions 413 go into the cladding 416 adjacent to the MRR 420. For example, the extensions 413 may extend a depth of approximately 220 nm into the cladding 416. The top of the extensions 413 may be substantially parallel to the top of the MRR 420 in some embodiments.

Figure 4C:
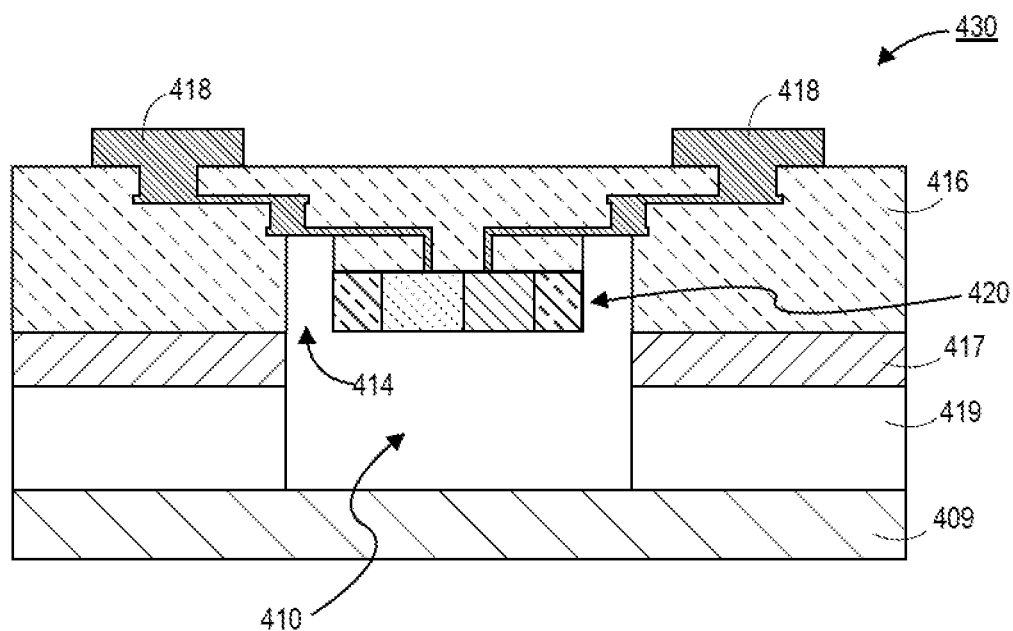
FIG. 4C is a cross-sectional illustration of an MRR in an OCPIC with a backside cavity that extends into the cladding past the thickness of the MRR and is sealed by a base on the backside of the OCPIC, in accordance with an embodiment.

Referring now to FIG. 4C, a cross-sectional illustration of an OCPIC 430 is shown, in accordance with an additional embodiment. In an embodiment, the OCPIC 430 in FIG. 4C may be substantially similar to the OCPIC 430 in FIG. 4B, with the exception of the depth of the extensions. For example, in FIG. 4C, extensions 414 may pass the top of the MRR 420. The extensions 414 may extend up to conductive routing in the cladding layer 416. For example, the extensions 414 may extend up to 2 µm past the top surface of the MRR 420.

Figure 5A:
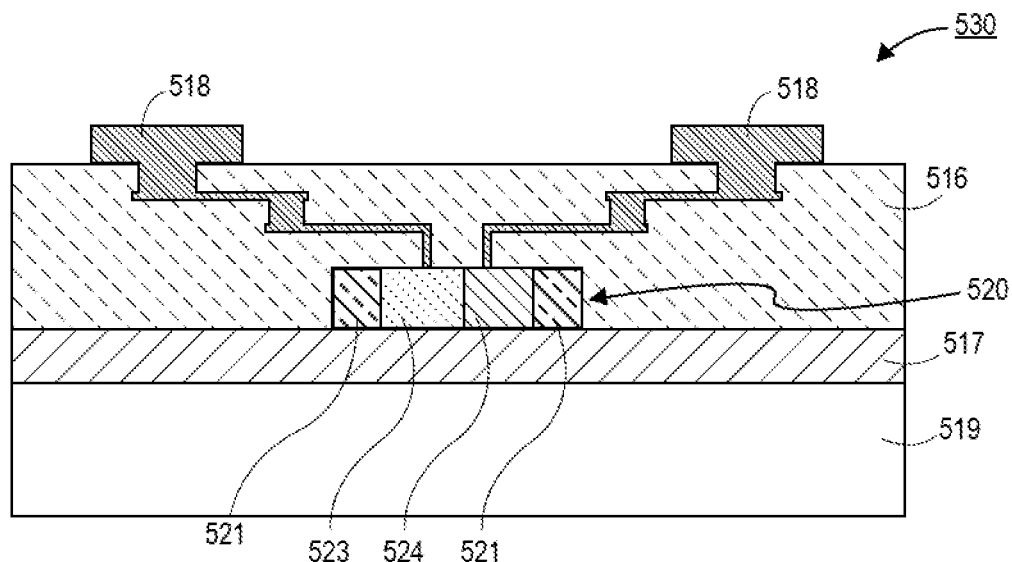
FIGS. 5A-5D are cross-sectional illustrations depicting a process for forming an MRR in an OCPIC with a base that covers a backside cavity under the MRR, in accordance with an embodiment.

Referring now to FIGS. 5A-5D, a series of cross-sectional illustrations of a process for fabricating an OCPIC is shown, in accordance with an embodiment. The cross-section shown in FIG. 5A is along the line 1-1' in FIG. 1A. In an embodiment, the OCPIC may include a bottom cavity that exposes the MRR. The cavity may be sealed by a base, such as a silicon or glass base.

Referring now to FIG. 5A, a cross-sectional illustration of a portion of an OCPIC 530 is shown, in accordance with an embodiment. In an embodiment, the OCPIC 530 comprises a silicon substrate 519. A BOX 517 is provided over the silicon substrate 519. In an embodiment, an MRR 520 is provided above the BOX 517 in a cladding layer 516. In an embodiment, the MRR 520 comprises intrinsic silicon regions 521 at the edges of the MRR 520. A lightly P-doped region 523 may be provided adjacent to one end of the intrinsic silicon region 521, and a highly P-doped (P$^+$) region 524 may be adjacent to the other end of the intrinsic silicon region 521. The P$^+$ region 524 and the lightly P-doped region 523 may contact each other at the center of the MRR 520. In an embodiment, heater contacts 526 may be provided over the P$^+$ region 524 and the lightly P-doped region 523. In an embodiment, the combination of the P$^+$ region 524 and the lightly P-doped region 523 may be considered as being the micro heater of the MRR 520. Heater contacts 526 couple the P$^+$ region 524 and the lightly P-doped region 523 to pads 518 on a top surface of the cladding layer 516.

Figure 5B:
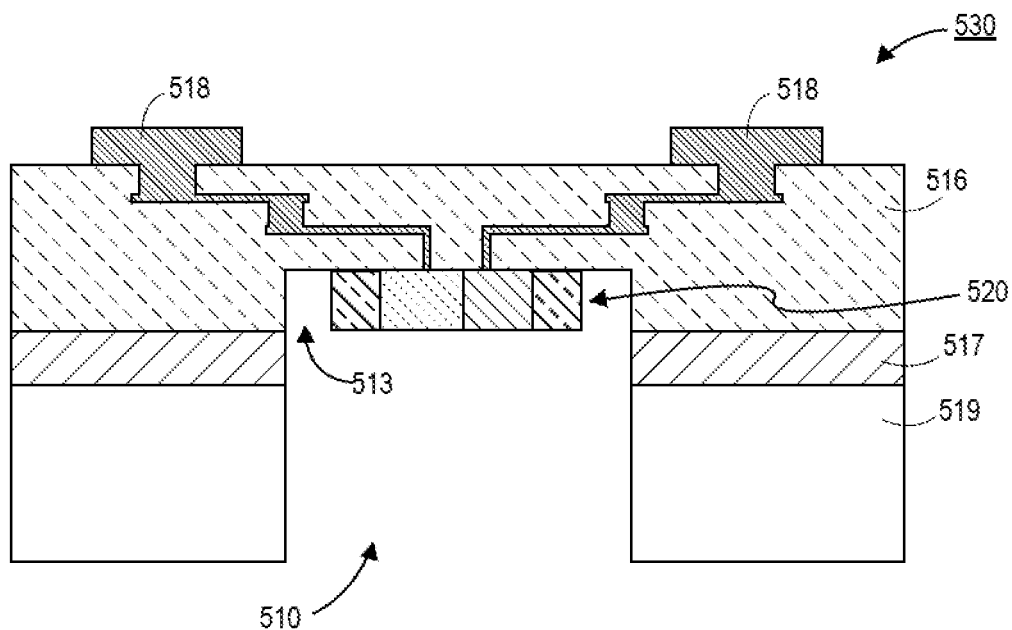

Referring now to FIG. 5B, a cross-sectional illustration of the OCPIC 530 after a cavity 510 is formed below the MRR 520 is shown, in accordance with an embodiment. In an embodiment, the cavity 510 may pass through the silicon substrate 519 and the BOX 517. Additionally, extensions 513 may pass into the cladding layer 516 adjacent to the MRR 520. In the illustrated embodiment, the extensions 513 extend to a top of the MRR 520. However, in other embodiments, the extensions 513 may extend further into the cladding layer 516. For example, the extensions 513 may extend up to the conductive routing in the cladding layer 516.

Figure 5C:
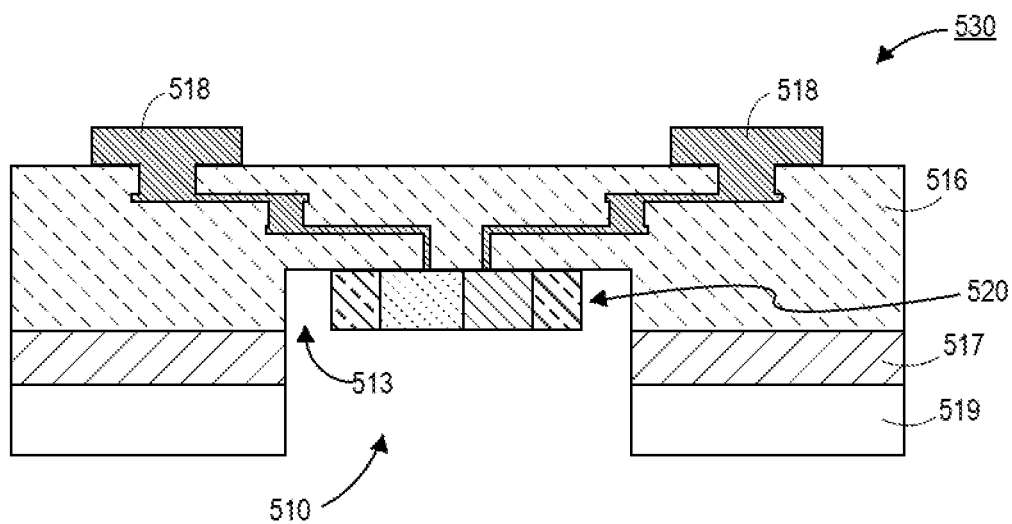

Referring now to FIG. 5C, a cross-sectional illustration of the OCPIC 530 after the silicon substrate 519 is thinned is shown, in accordance with an embodiment. In an embodiment, the silicon substrate 519 may be reduced in thickness to approximately 20 μm or less. The silicon substrate 519 may be recessed with a polishing process such as a chemical mechanical planarization (CMP) process.

Figure 5D:
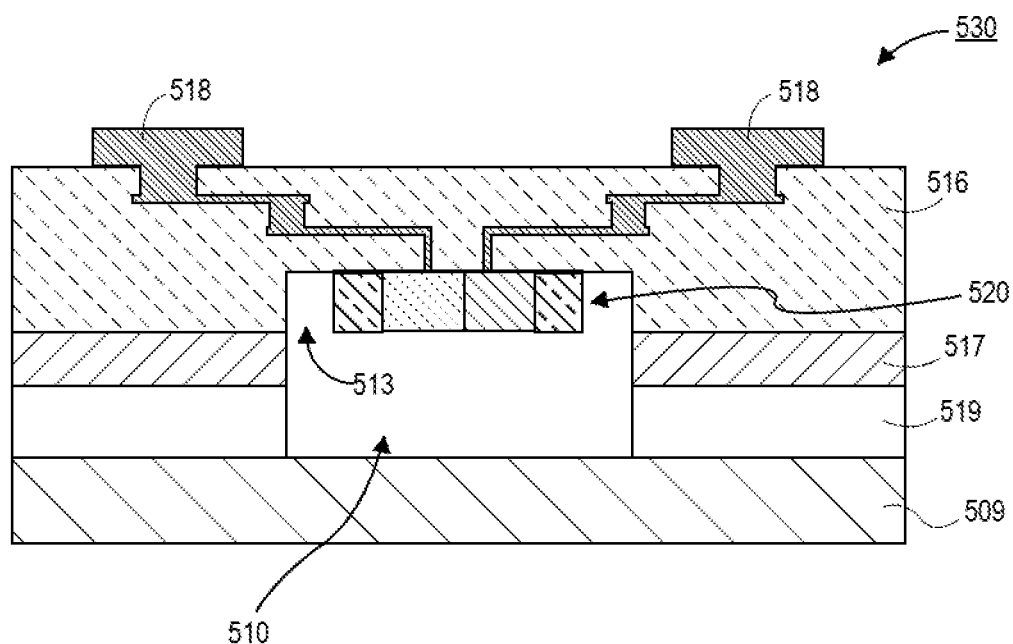

Referring now to FIG. 5D, a cross-sectional illustration of the OCPIC 530 after a base 509 is attached to the silicon substrate 519 is shown, in accordance with an embodiment. In an embodiment, the base 509 may be attached to the silicon substrate 519 by an adhesive or by a bonding process (e.g., diffusion bonding). The base 509 may comprise silicon. In other embodiments, the base 509 may comprise glass. The base 509 seals the cavity 510. In an embodiment, the base 509 may be thicker than the silicon substrate 519. In a particular embodiment, the thickness of the base 509 may be between approximately 30 μm and approximately 180 μm.

Figure 6A:
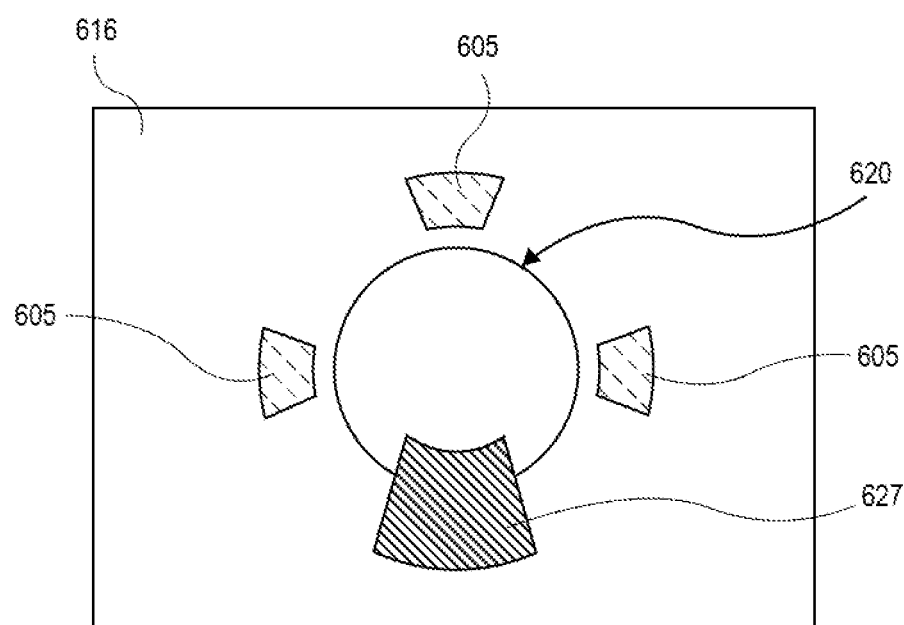
FIG. 6A is a plan view illustration of a MRR with a heater and sensors, in accordance with an embodiment.

In the embodiments described above, thermal isolation techniques are used in order to thermally isolate the MRR. In addition to good thermal isolation, it is important to provide high precision temperature measurement of the temperature of the MRR. An existing solution for temperature measurement is shown in FIG. 6A. As shown, an MRR 620 includes a heater 627. A plurality of temperature sensors 605 may be provided around the perimeter of the MRR 620. However, such an architecture results in a large thermal gradient between the MRR and the sensors 605 due to a low thermal conductivity of the oxide cladding. Thus, the sensors placed outside the MRR cannot accurately track the MRR temperature. Instead, the temperature reading from the sensors 605 can be used as a reference to control the heater based on a simulation-derived correlation. However, the temperature correlation between the sensors 605 and the MRR 620 will not be consistent when there is additional thermal cross-talk coming from the other components (e.g., EIC or CPU/GPU/FPGA) in the same multi-chip package.

Accordingly, embodiments disclosed herein include temperature sensor architectures that are capable of directly measuring the temperature of the MRR. This is done by providing thin conductive traces directly above the MRR. For example, the conductive traces may be approximately 2 μm above the MRR to avoid light absorption by the metal. The conductive traces may be thermally coupled to the MRR by an interface layer. For example, the interface layer may include a thermal conductor with a low refraction index (e.g., SiN, $Si_3N_4$, or AlN). As such, the temperature of the MRR is easily propagated to the sensor. In an embodiment, such sensor architectures allow for more accurately tracking the MRR temperature, and can use the measured temperature to achieve thermal stabilization of the MRR. Embodiments enable an increase in the MRR thermal tuning efficiency and avoids undesirable thermal run away. This makes the MRR more reliable.

Figure 6B:
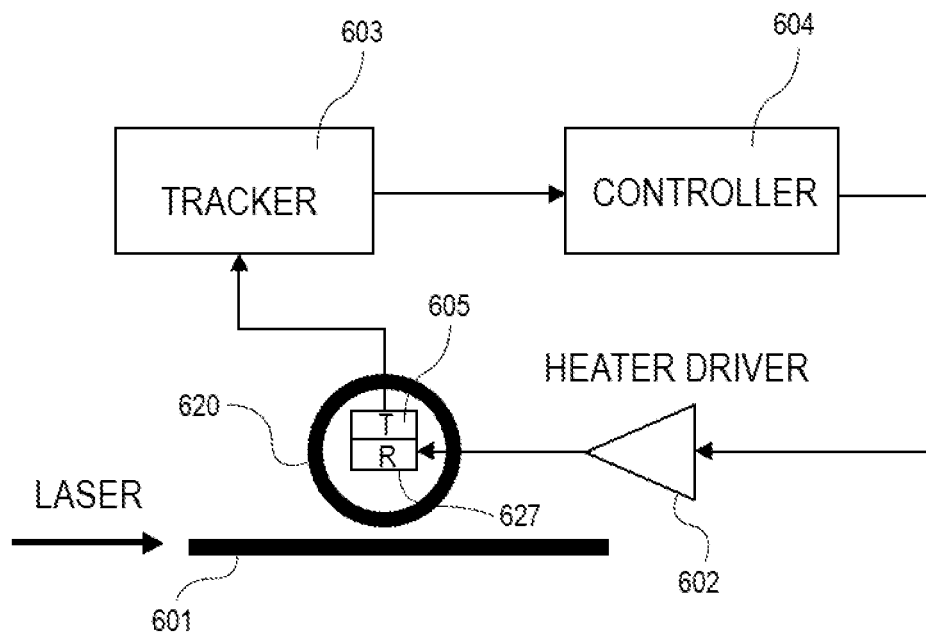
FIG. 6B is a control diagram that illustrates the control architecture for driving the temperature of a heater in the MRR, in accordance with an embodiment.

Referring now to FIG. 6B, a control loop which controls the micro heater by tracking the MRR temperature is shown, in accordance with an embodiment. The MRR temperature is measured by a temperature sensor 605. The tracker circuit 603 will provide a track value based on the measured temperature to the controller 604. The controller 604 will use information from the tracker circuit 603 to control the driver 602 and the micro heater 627 to maintain the MRR 620 at a desired temperature.

Figure 6C:
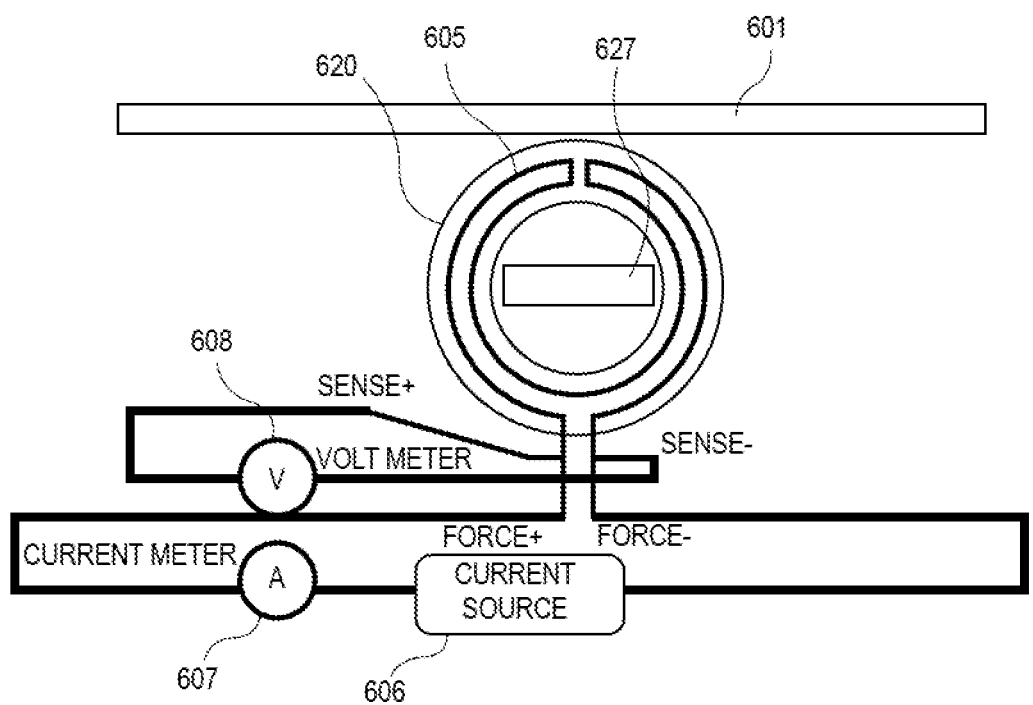
FIG. 6C is a schematic that illustrates the circuitry for running a sensor to measure the temperature of the heater in an MRR, in accordance with an embodiment.

Referring now to FIG. 6C, an example of an MRR 620 temperature sensor 605 design is shown, in accordance with an embodiment. In an embodiment, a micro heater 627 may be provided in a middle of the MRR 620. A waveguide 601 may run adjacent to the MRR 620. In an embodiment, the sensor 605 may be provided directly above the MRR 620. For example, a conductive trace may be laid out above the top surface of the MRR 620. For example, the conductive trace may include one or more of TiN, Cr, Pt, Ti, W, Al, TiW, Ni, and nichrome. The sensor 605 may be electrically coupled to a volt meter 608 and a current meter 607. Current to the system may be supplied by a current source 606.

Figure 7A:
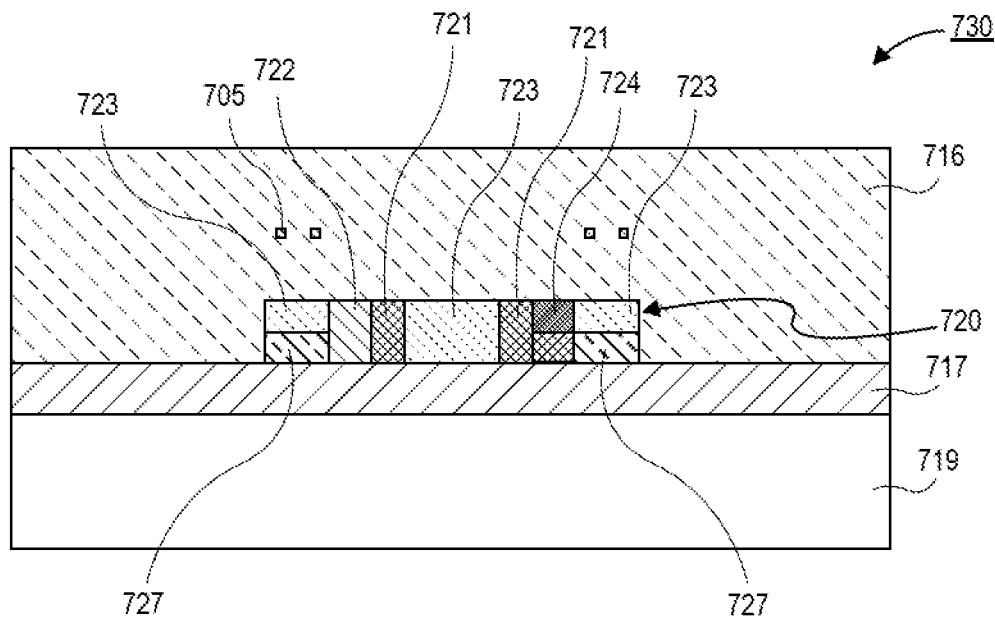
FIG. 7A is a cross-sectional illustration of an MRR in an OCPIC with a sensor over the MRR, in accordance with an embodiment.

Referring now to FIG. 7A, a cross-sectional illustration of a portion of an OCPIC 730 is shown, in accordance with an embodiment. The cross-section illustrated in FIG. 7A is along the line 2-2' in FIG. 1A. In an embodiment, the OCPIC 730 comprises a silicon substrate 719. A BOX 717 may be provided over the silicon substrate 719. In an embodiment, an MRR 720 is provided over the BOX 717. The MRR 720 may have any MRR architecture. For example, a first layer 727 may be N-doped, and a second layer 723 may be P-doped. A portion of the micro heater may be provided at a center of the MRR 720. For example, a lightly-doped P region 723 and a heavily-doped P region 724 may be part of the micro heater. Intrinsic silicon 721 may border the heavily-doped P region 724 and the lightly-doped P region 723. In an embodiment, a heavily N-doped ($N^+$) region 722 and a heavily P-doped ($P^+$) region 724 may be provided on opposite ends of the MRR 720. In an embodiment, a sensor 705 may be provided above the MRR 720. For example, the sensor 705 may comprise conductive wires or traces that are embedded in a cladding layer 716. The sensor 705 may be approximately 2 μm or more away from the MRR 720 in order to prevent light absorption by the metal.

Figure 7B:
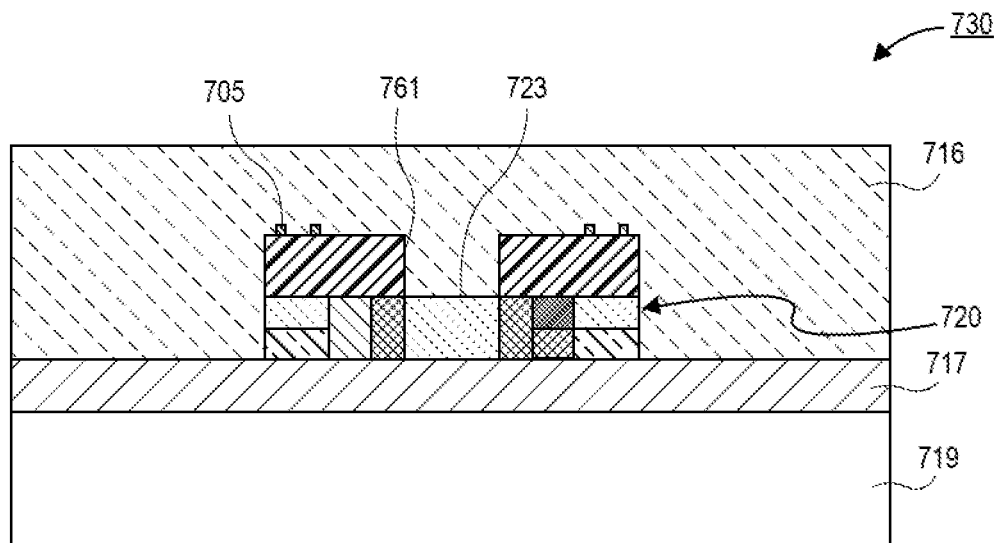
FIG. 7B is a cross-sectional illustration of an MRR in an OCPIC with a sensor that is thermally coupled to the MRR by an interface layer, in accordance with an embodiment.

Referring now to FIG. 7B, a cross-sectional illustration of an OCPIC 730 is shown, in accordance with an additional embodiment. The OCPIC 730 in FIG. 7B may be substantially similar to the OCPIC 730 in FIG. 7A, with the exception of the region between the sensor 705 and the MRR 720. Instead of having the cladding layer 716 between the sensor 705 and the MRR 720, an interface layer 761 is provided between the sensor 705 and the MRR 720. The interface layer 761 may be a thermal conductor with a low refraction index. For example, the interface layer 761 may comprise SiN, $Si_3N_4$, or AlN. The interface layer 761 provides thermal coupling between the MRR 720 and the sensor 705. As such, a more accurate temperature of the MRR 720 can be determined compared to embodiments such as the one shown in FIG. 7A.

Figure 7C:
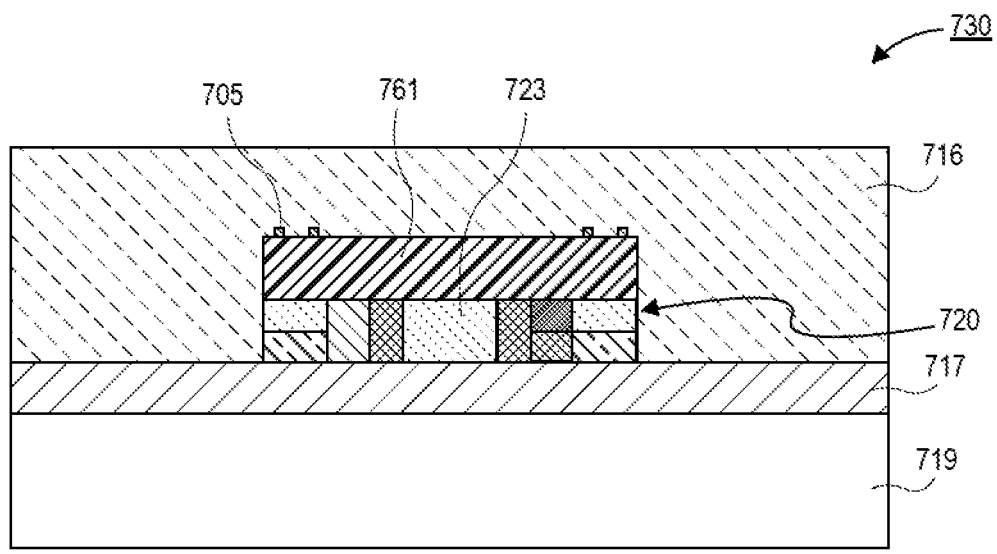
FIG. 7C is a cross-sectional illustration of an MRR in an OCPIC with a sensor that is thermally coupled to the MRR by an interface layer that extends over the heater, in accordance with an embodiment.

Referring now to FIG. 7C, a cross-sectional illustration of an OCPIC 730 is shown, in accordance with an additional embodiment. The OCPIC 730 in FIG. 7C may be substantially similar to the OCPIC 730 in FIG. 7B, with the exception of the structure of the interface layer 761. Instead of being only over the MRR 720, the interface layer 761 also extends over a top surface of the micro heater. Increasing the volume of the interface layer 761 may generally decrease the temperature of the MRR 720 for a given current in the heater. However, the temperature measurement accuracy of the sensors 705 are generally seen to be within 1° C. of the actual temperature of the MRR 720.

In embodiments described above thermal isolation cavities are described as ways to improve the thermal isolation of the MRRs. Generally, cavities with larger diameters provide better thermal isolation. However, there is a practical limit to the diameter of the cavity. Particularly, for reliability purposes, the cavities cannot extend below the bumps on the top side of the OCPIC. In order to provide more space for the cavity, it has been standard practice to place the MRRs in the center between bumps in an array.

Figure 8A:
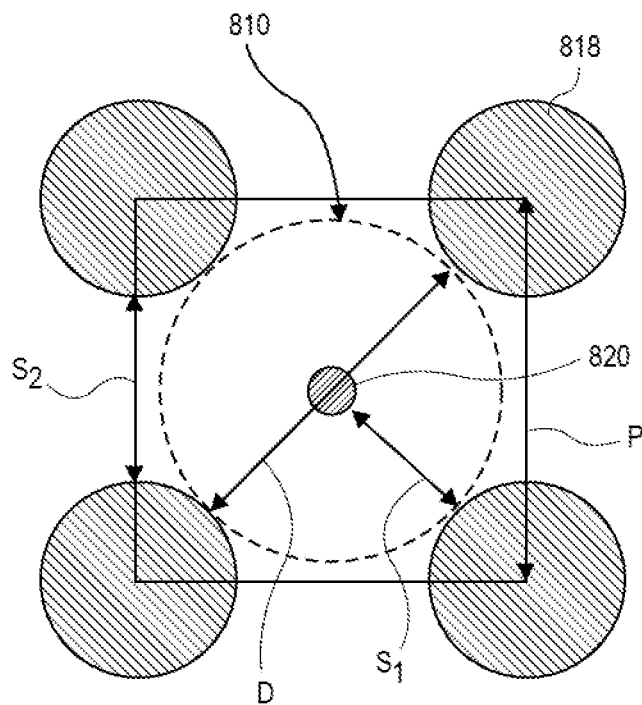
FIG. 8A is a plan view illustration of the bump layout around an MRR with a backside cavity, in accordance with an embodiment.

For example, FIG. 8A provides an example of a typical bump and MRR layout. As shown, the bumps 818 are provided in a square pattern with the MRR 820 centered between the four bumps 818. In the illustrated embodiment, the pitch P between the bumps is 55 μm, and the bumps 818 have a 31 μm diameter. The MRR 820 has a 9 μm diameter. This results in a first spacing $S_1$ between the MRR 820 and the bumps 818 being approximately 18.9 μm. The second spacing $S_2$ between the neighboring bumps 818 is 24 μm. Ultimately, such a configuration results in a cavity 810 diameter D that is approximately 46.8 μm.

Figure 8B:
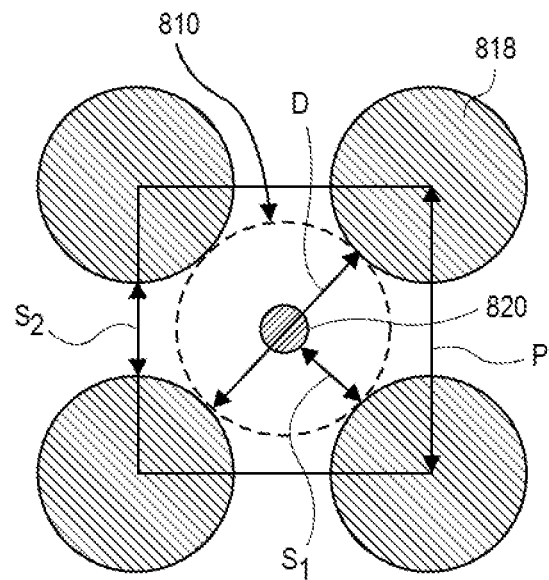
FIG. 8B is a plan view illustration of the bump layout around an MRR with a backside cavity, in accordance with an additional embodiment.

Referring now to FIG. 8B, a plan view illustration of a bump and MRR 820 layout with a smaller pitch P is shown, in accordance with an embodiment. In FIG. 8B, the pitch P is 45 μm. Reducing the pitch P results in the other dimensions being reduced as well. For example the spacing $S_1$ is now 11.8 μm, the spacing $S_2$ is now 14 μm, and the diameter D that is approximately 32.6 μm. As can be seen, reductions in the pitch in order to increase the density of the bumps 818 (and the WDM density) results in smaller cavities 810. This negatively impacts the thermal isolation of the MRR 820.

Figure 8C:
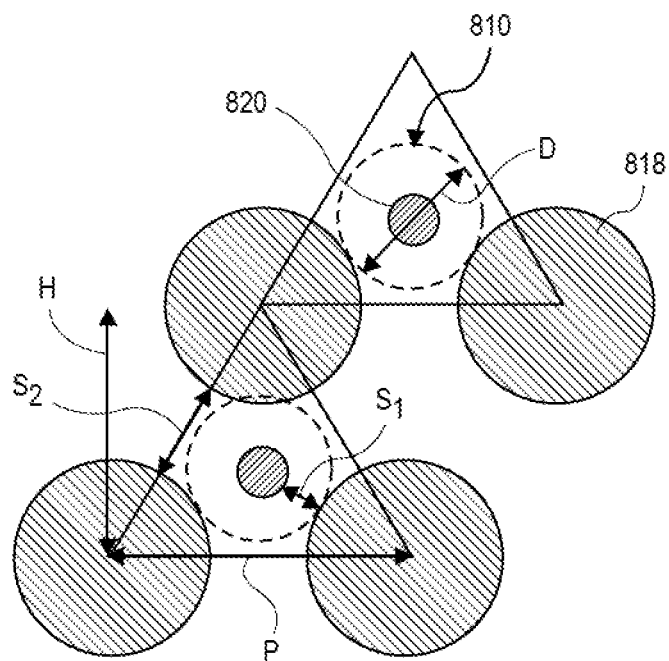
FIG. 8C is a plan view illustration of an offset bump layout around an MRR with a backside cavity, in accordance with an embodiment.

Referring now to FIG. 8C, a plan view illustration of a bump and MRR 820 layout with a triangular layout is shown, in accordance with an embodiment. As shown, the pitch P remains 55 μm. A vertical spacing H between centers of the bumps 818 in different rows is 47.6 μm. This results in the first spacing $S_1$ being 11.8 μm, and the second spacing $S_2$ being 24 μm. The diameter D of the cavity 810 is still only 32.6 μm. Accordingly, different bump and MRR layouts still result in small cavity 810 diameters D when the MRR 820 is placed in the middle of the bumps 818.

Figure 9:
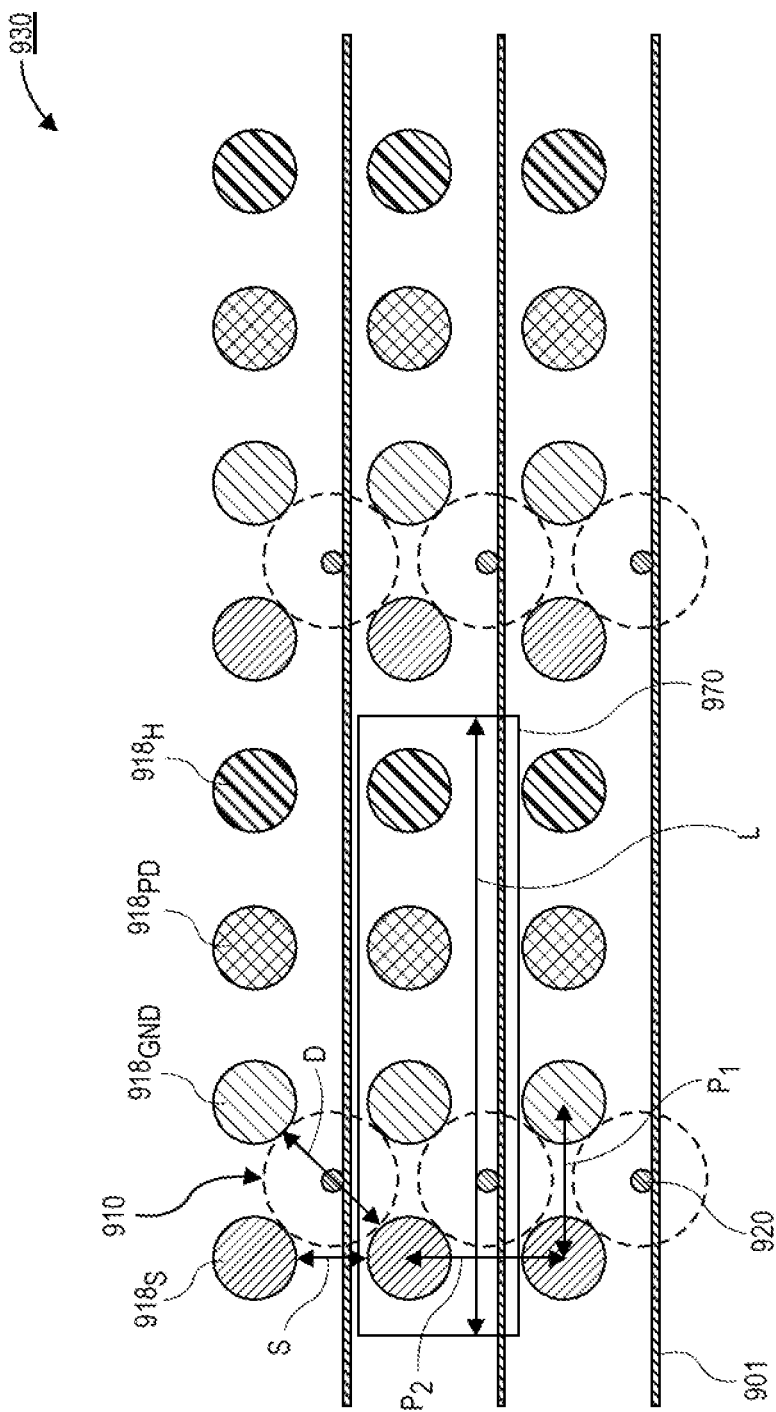
FIG. 9 is a plan view illustration of a plurality of $T_X$ cells of an OCPIC with MRRs that are provided between bumps, in accordance with an embodiment.

This is clearly shown in FIG. 9, which is a layout of a plurality of $T_X$ cells 970 in an OCPIC 930. As shown, each cell 970 comprises a set of four bumps 918 that are arranged in a row. The MRRs 920 are positioned between bumps 918 in adjacent $T_X$ cells 970. Waveguides 901 are provided adjacent to the MRRs 920. In an embodiment, each $T_X$ cell 970 comprises a signal bump $918_S$, a ground bump $918_{GND}$, a photo detector bump $918_{PD}$, and a heater bump $918_H$.

In the illustrated embodiment, the horizontal pitch $P_1$ and the vertical pitch $P_2$ are both 55 μm. This leads to a length L of the $T_X$ cell 970 being approximately 220 μm. As described in greater detail above, the maximum diameter D of the cavities 910 with a 55 μm pitch in a square pattern is 46.8 μm.

In order to increase the available space for the cavities, embodiments reorganize the layout. Particularly, the MRRs are moved to be in the row along with the bumps. In order to mitigate the extra length needed to accommodate the MRRs, the horizontal pitch is reduced. An example of such an embodiment is shown in FIG. 10A.

Figure 10A:
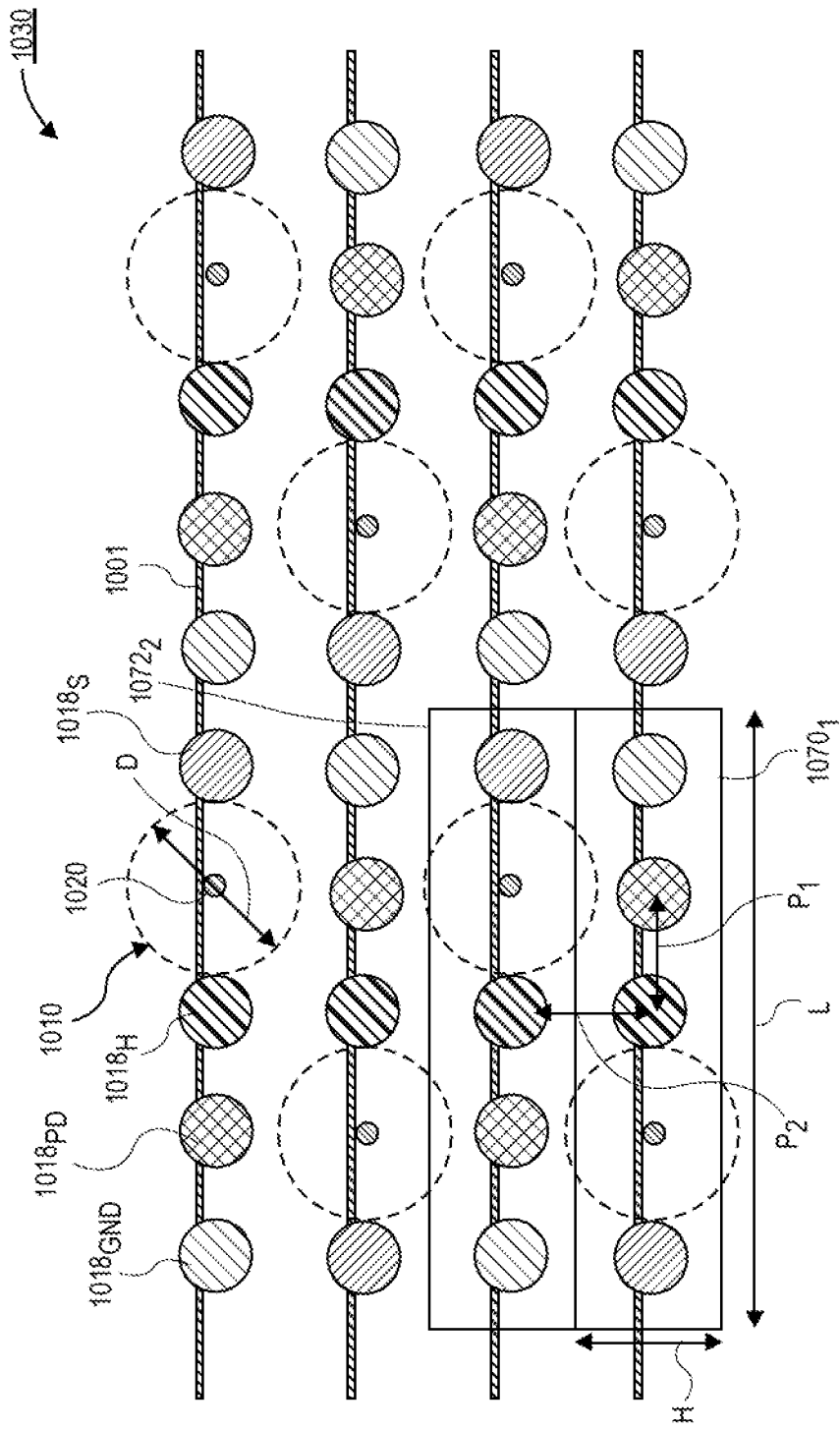
FIG. 10A is a plan view illustration of a plurality of $T_X$ cells of an OCPIC with MRRs that are provided in line with the bumps, in accordance with an embodiment.

Referring now to FIG. 10A, a plan view illustration of a portion of an OCPIC 1030 is shown, in accordance with an embodiment. A plurality of $T_X$ cells 1070 are provided. In an embodiment, the $T_X$ cells 1070 are arranged in rows with mirror images to each other. For example, $T_X$ cell 1070₁ starts with a signal bump $1018_S$ and ends with a ground bump $1018_{GND}$, and $T_X$ cell 1070₂ starts with a ground bump $1018_{GND}$ and ends with a signal bump $1018_S$. A heater bump $1018_X$, a photo detector bump $1018_{PD}$ and an MRR 1020 may be provided between the signal bump $1018_S$ and the ground bump $1018_{GND}$. In an embodiment, the horizontal pitch $P_1$ is reduced compared to the embodiment shown in FIG. 9. For example, the horizontal pitch $P_1$ may be 45 μm. As a result of the decrease in the horizontal pitch $P_1$, the length L of the $T_X$ cells 1070 are only slightly increased to 225 μm, despite having an extra feature (i.e., the MRR 1020) in the row. In an embodiment, the vertical pitch $P_2$ may remain at 55 μm to provide a height H of the cell that is approximately 55 μm. In an embodiment, the diameter D of the cavities 1010 may be increased to 59 μm. Accordingly, an improved thermal isolation for the MRRs 1020 is provided. Additionally, the mirror image orientation results in the signaling bumps being far from each other, and reduces unwanted cross-talk between signals.

Figure 10B:
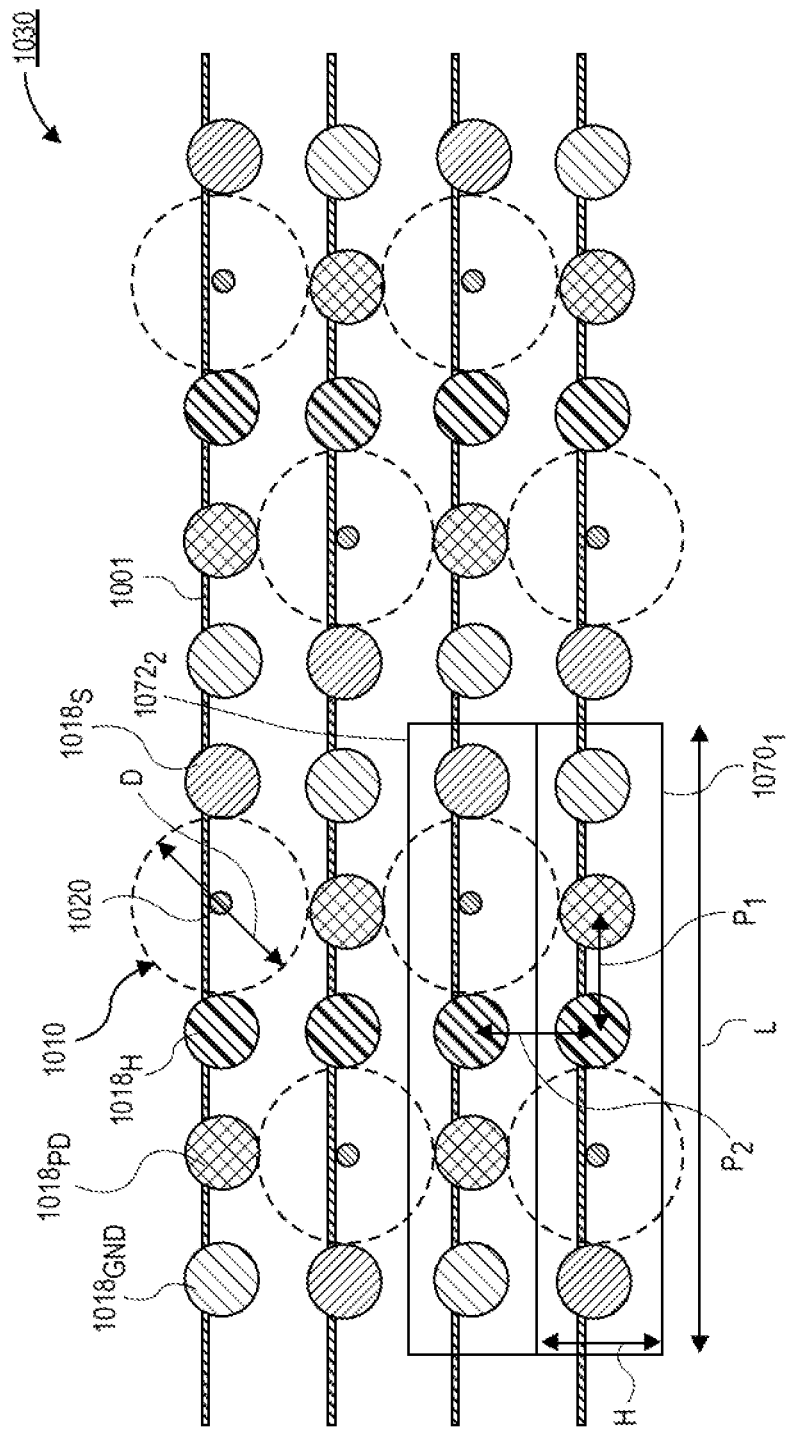
FIG. 10B is a plan view illustration of a plurality of $T_X$ cells of an OCPIC with MRRs that are provided in line with the bumps, in accordance with an embodiment.

Referring now to FIG. 10B, a plan view illustration of an OCPIC 1030 is shown, in accordance with an additional embodiment. The embodiment shown in FIG. 10B may be substantially similar to the embodiment shown in FIG. 10A, with the exception of the vertical pitch $P_2$. In FIG. 10B, the vertical pitch $P_2$ is reduced to 45 μm as well. Decreasing the vertical pitch $P_2$ allows for an increase in the waveguide density (WDM density). Additionally, it is to be appreciated that the diameter D of the cavities 1010 remains at 59 μm. Accordingly, an increase in device density is provided without sacrificing thermal isolation of the MRRs 1020.

Figure 10C:
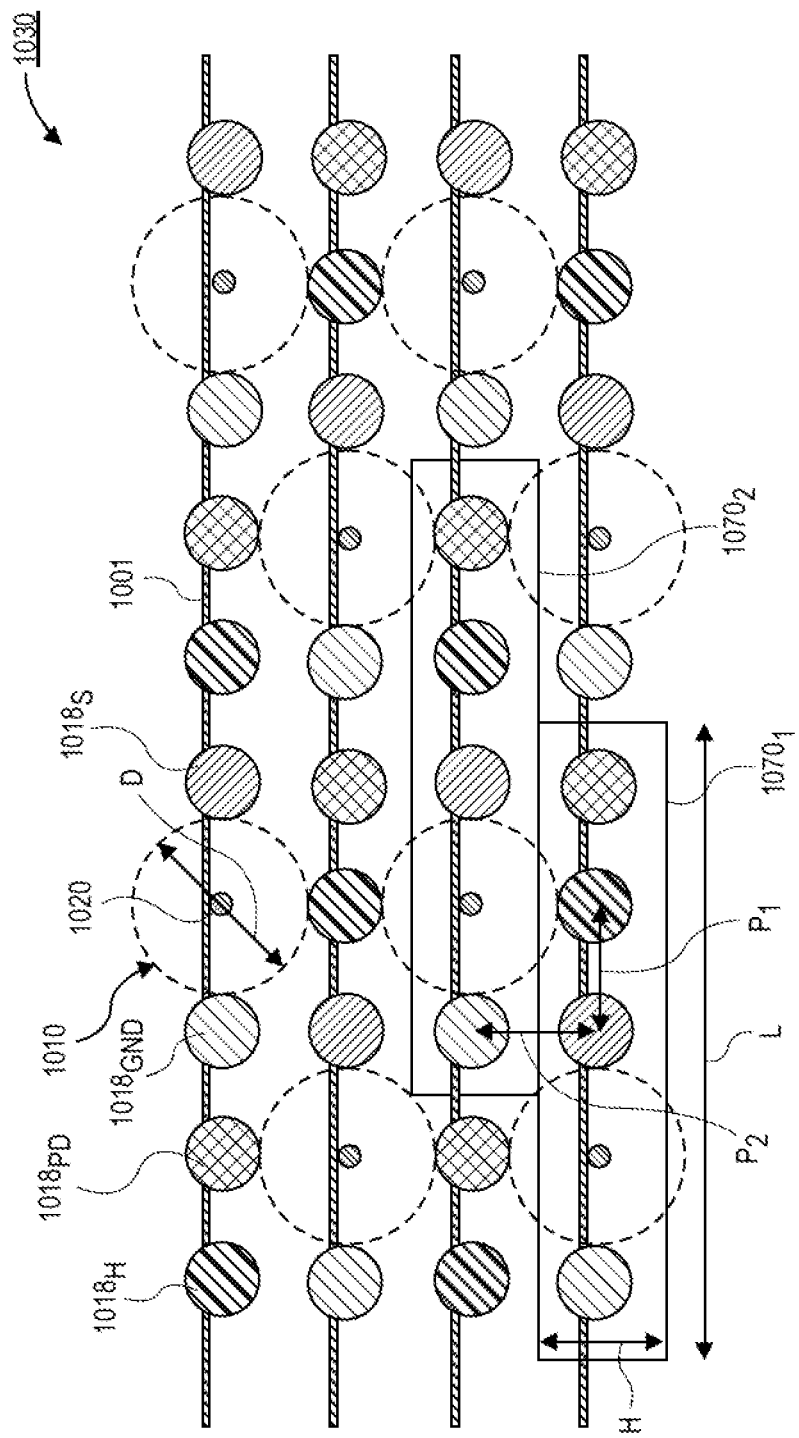
FIG. 10C is a plan view illustration of a plurality of $T_X$ cells of an OCPIC with MRRs that are provided in line with the bumps, and where the $T_X$ cells are offset from each other, in accordance with an embodiment.

Referring now to FIG. 10C, a plan view illustration of an OCPIC 1030 is shown, in accordance with an additional embodiment. In the embodiment shown in FIG. 10C, each $T_X$ cell 1070 includes the same bump layout (e.g., $1018_{GND}$, MRR 1020, $1018_S$, $1018_H$, $1018_{PD}$). However, the neighboring $T_X$ cells 1070 are offset from each other. Particularly, the offset is by two positions. For example, in $T_X$ cell 1070₂ the starting ground bump $1018_{GND}$ is provided above the signal bump $1018_S$ in the underlying $T_X$ cell 1070₁.

Figure 10D:
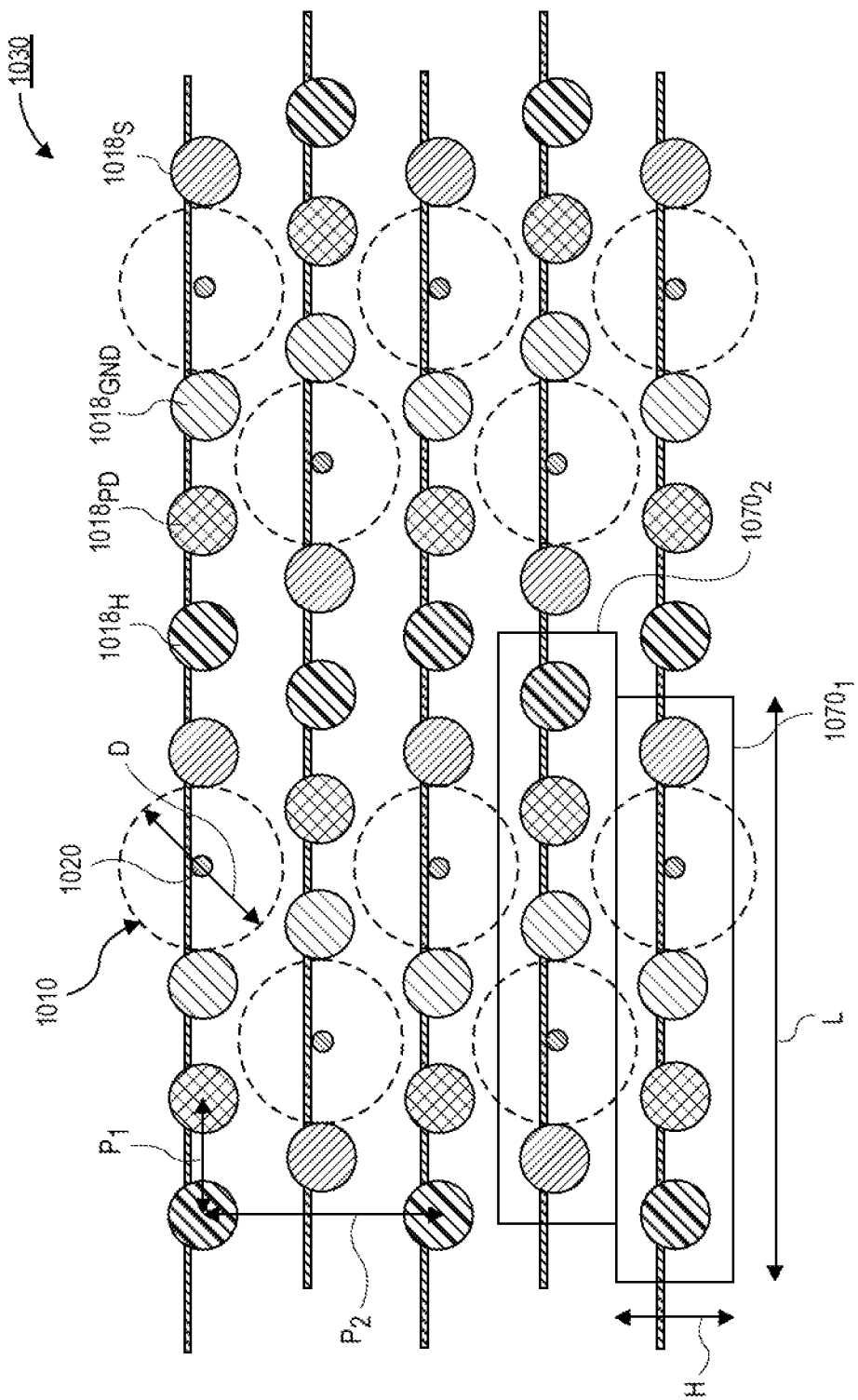
FIG. 10D is a plan view illustration of a plurality of $T_X$ cells of an OCPIC with MRRs that are provided in line with the bumps, and where the $T_X$ cells form a hexagonal bump layout, in accordance with an embodiment.

Referring now to FIG. 10D, a plan view illustration of an OCPIC 1030 is shown, in accordance with yet another additional embodiment. In the embodiment shown, the bump layout is a hexagonal pattern. That is, the neighboring $T_X$ cells 1070 are offset by half a position. The offset doubles the vertical pitch $P_2$ so that it is now 90 μm. Additionally, neighboring $T_X$ cells 1070 are mirror images of each other. For example, $T_X$ cell 1070₁ is a mirror image of $T_X$ cell 1070₂. In the hexagonal pattern, there is still enough space around the MRRs 1020 to allow for cavities 1010 with a 59 μm diameter D.

Figure 11:
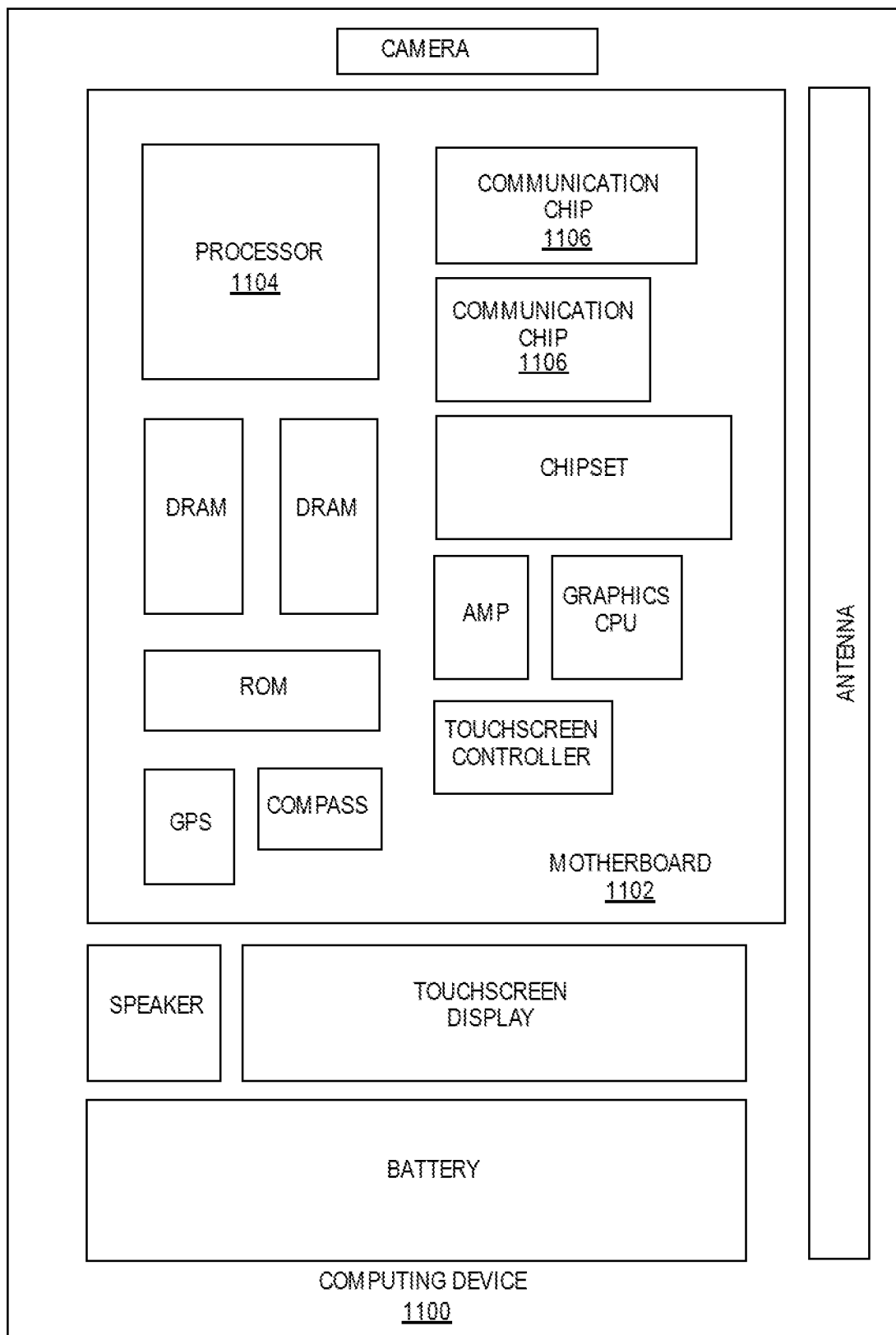
FIG. 11 is a schematic of a computing device built in accordance with an embodiment.

FIG. 11 illustrates a computing device 1100 in accordance with one implementation of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the invention, the integrated circuit die of the processor may be part of an electronic package that includes an OCPIC with improved thermal isolation and/or temperature control, in accordance with embodiments described herein. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of the invention, the integrated circuit die of the communication chip may be part of an electronic package that includes an OCPIC with improved thermal isolation and/or temperature control, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an optoelectronic system, comprising: a first substrate; a second substrate over the first substrate; a micro-ring resonator (MRR) over the second substrate; a heater integrated into the MRR; a cladding over the MRR; and a temperature sensor over the MRR in the cladding.

Example 2: the optoelectronic system of Example 1, further comprising: an interface layer between the temperature sensor and the MRR.

Example 3: the optoelectronic system of Example 2, wherein the interface layer is not over the heater.

Example 4: the optoelectronic system of Example 2, wherein the interface layer is over the heater.

Example 5: the optoelectronic system of Examples 2-4, wherein the interface layer is a thermal conductor.

Example 6: the optoelectronic system of Example 5, wherein the thermal conductor comprises silicon and nitrogen.

Example 7: the optoelectronic system of Examples 1-6, wherein the temperature sensor is approximately 2 microns away from the MRR.

Example 8: the optoelectronic system of Examples 1-7, wherein the heater is positioned in the center of the MRR.

Example 9: the optoelectronic system of Examples 1-8, further comprising: contacts coupled to a top surface of the MRR.

Example 10: the optoelectronic system of Example 9, wherein the contacts are electrically coupled to pads on a top surface of the cladding.

Example 11: the optoelectronic system of Examples 1-10, wherein the MRR has a thickness that is approximately 250 nm or less.

Example 12: an optoelectronic system, comprising: a waveguide; a microring adjacent to the waveguide; a heater within a perimeter of the microring; and a sensor directly over the microring.

Example 13: the optoelectronic system of Example 12, wherein the sensor comprises a conductive trace that is provided vertically above the microring.

Example 14: the optoelectronic system of Example 13, wherein the conductive trace is thermally coupled to the microring by a thermal interface layer.

Example 15: the optoelectronic system of Example 14, wherein the thermal interface layer comprises silicon and nitrogen.

Example 16: the optoelectronic system of Examples 13-15, wherein the thermal interface layer does not cover a top surface of the heater.

Example 17: the optoelectronic system of Examples 13-15, wherein the thermal interface layer covers a top surface of the heater.

Example 18: an optoelectronic system, comprising: a package substrate; a photonics integrated circuit (PIC) coupled to the package substrate, wherein the PIC comprises: a first substrate; a second substrate over the first substrate; a micro-ring resonator (MRR) over the second substrate; a heater integrated into the MRR; a cladding over the MRR; and a temperature sensor over the MRR in the cladding; and an electronic integrated circuit (EIC) coupled to the PIC.

Example 19: the optoelectronic system of Example 18, further comprising: an interface layer between the temperature sensor and the MRR.

Example 20: the optoelectronic system of Example 19, wherein the interface layer comprises silicon and nitrogen.

What is claimed is:

1. An optoelectronic system, comprising:
a first substrate;
a second substrate over the first substrate;
a micro-ring resonator (MRR) over the second substrate;
a heater integrated into the MRR;
a cladding over the MRR; and
a temperature sensor over the MRR in the cladding.

2. The optoelectronic system of claim 1, further comprising:
an interface layer between the temperature sensor and the MRR.

3. The optoelectronic system of claim 2, wherein the interface layer is not over the heater.

4. The optoelectronic system of claim 2, wherein the interface layer is over the heater.

5. The optoelectronic system of claim 2, wherein the interface layer is a thermal conductor.

6. The optoelectronic system of claim 5, wherein the thermal conductor comprises silicon and nitrogen.

7. The optoelectronic system of claim 1, wherein the temperature sensor is approximately 2 microns away from the MRR.

8. The optoelectronic system of claim 1, wherein the heater is positioned in the center of the MRR.

9. The optoelectronic system of claim 1, further comprising:
contacts coupled to a top surface of the MRR.

10. The optoelectronic system of claim 9, wherein the contacts are electrically coupled to pads on a top surface of the cladding.

11. The optoelectronic system of claim 1, wherein the MRR has a thickness that is approximately 250 nm or less.

12. An optoelectronic system, comprising:
a waveguide;
a micro-ring adjacent to the waveguide;
a heater within a perimeter of the micro-ring; and
a sensor directly over the micro-ring.

13. The optoelectronic system of claim 12, wherein the sensor comprises a conductive trace that is provided vertically above the micro-ring.

14. The optoelectronic system of claim 13, wherein the conductive trace is thermally coupled to the micro-ring by a thermal interface layer.

15. The optoelectronic system of claim 14, wherein the thermal interface layer comprises silicon and nitrogen.

16. The optoelectronic system of claim 13, wherein the thermal interface layer does not cover a top surface of the heater.

17. The optoelectronic system of claim 13, wherein the thermal interface layer covers a top surface of the heater.

18. An optoelectronic system, comprising:
a package substrate;
a photonics integrated circuit (PIC) coupled to the package substrate, wherein the PIC comprises:
a first substrate;
a second substrate over the first substrate;
a micro-ring resonator (MRR) over the second substrate;
a heater integrated into the MRR;
a cladding over the MRR; and
a temperature sensor over the MRR in the cladding; and
an electronic integrated circuit (EIC) coupled to the PIC.

19. The optoelectronic system of claim 18, further comprising:
an interface layer between the temperature sensor and the MRR.

20. The optoelectronic system of claim 19, wherein the interface layer comprises silicon and nitrogen.

* * * * *